(12) United States Patent
Bieber et al.

(10) Patent No.: US 12,316,311 B2
(45) Date of Patent: May 27, 2025

(54) ISOLATED GATE DRIVER

(71) Applicant: Solaredge Technologies Ltd., Herzeliya (IL)

(72) Inventors: Ofir Bieber, Ra'anana (IL); Tomer Bar-On, Harutzim (IL); Shay Avner, Tel-Aviv (IL); Sergey Pivnik, Haifa (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 18/352,484

(22) Filed: Jul. 14, 2023

(65) Prior Publication Data

US 2024/0030911 A1 Jan. 25, 2024

Related U.S. Application Data

(60) Provisional application No. 63/436,242, filed on Dec. 30, 2022, provisional application No. 63/390,611, filed on Jul. 19, 2022.

(51) Int. Cl.
*H02M 1/08* (2006.01)
*H03K 17/687* (2006.01)
*H02M 3/335* (2006.01)

(52) U.S. Cl.
CPC .......... *H03K 17/6871* (2013.01); *H02M 1/08* (2013.01); *H02M 3/33523* (2013.01);
(Continued)

(58) Field of Classification Search
CPC .. H02M 1/08; H02M 3/33523; H03K 17/687; H03K 17/6871
(Continued)

(56) References Cited

U.S. PATENT DOCUMENTS 5,272,398 A 12/1993 Schroder-Brumloop et al.
5,596,466 A 1/1997 Ochi
(Continued)

FOREIGN PATENT DOCUMENTS

EP 3896855 A1 10/2021

OTHER PUBLICATIONS

Liu, Zhidong, "Design of On-Chip Gate Drivers with Power-Efficient High-Speed Level Shifting and Dynamic Timing Control for High-Voltage Synchronous Switching Power Converters," IEEE Journal of Solid-State Circuits, vol. 50, Issue 6, Jun. 2015.
(Continued)

*Primary Examiner* — William Hernandez
(74) *Attorney, Agent, or Firm* — Banner & Witcoff, Ltd.

(57) ABSTRACT

An apparatus comprising an input stage comprising a first input, a second input, a first AC coupler, and a second AC coupler. The first AC coupler is coupled between the first input and a third input. The second AC coupler is coupled between the second input and a fourth input. A comparator coupled to the third input, the fourth input, and an output. The comparator provides an output signal at the output based on a comparison between a level of a first voltage at the third input, and a level of a second voltage at the fourth input. A feedback circuit, coupled to the output, the third input, and the fourth input. The feedback circuit receives the output signal, and provides, based on the output signal, a first feedback voltage to the third input.

19 Claims, 18 Drawing Sheets

(52) U.S. Cl.
CPC ............... *H03K 2217/0063* (2013.01); *H03K 2217/0072* (2013.01)

(58) Field of Classification Search
USPC .................................. 327/108, 109, 110, 111
See application file for complete search history.

(56) References Cited

U.S. PATENT DOCUMENTS

| | | | |
|---|---|---|---|
| 5,831,562 A * | 11/1998 | Van Auken | H03M 1/0682 |
| | | | 341/122 |
| 6,646,469 B2 | 11/2003 | Yushan | |
| 9,628,072 B2 | 4/2017 | Toshiyuki et al. | |
| 9,966,944 B2 | 5/2018 | Rossi et al. | |
| 10,122,362 B2 | 11/2018 | Cascio et al. | |
| 10,574,229 B1 | 2/2020 | Nandi | |
| 11,159,170 B1 | 10/2021 | Sarraj | |
| 11,201,619 B2 | 12/2021 | Rinne et al. | |
| 2011/0205098 A1 * | 8/2011 | Sabut | H03F 3/005 |
| | | | 330/252 |
| 2012/0229165 A1 | 9/2012 | Tseng et al. | |

OTHER PUBLICATIONS

Liu, Dawei et al., "Design of 370 ps Delay Floating Voltage Level Shifters with 30 V/ns Power Supply Slew Tolerance," IEEE Transactions on Circuits and Systems II: Express Briefs, vol. 63, Issue 7, Jun. 2016.

Nov. 23, 2023, European Search Report, EP App. No. 23186510.6.

* cited by examiner

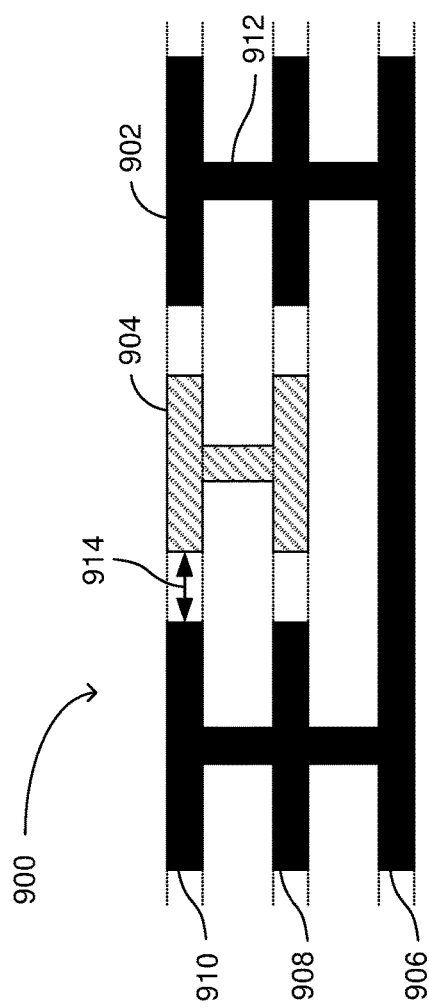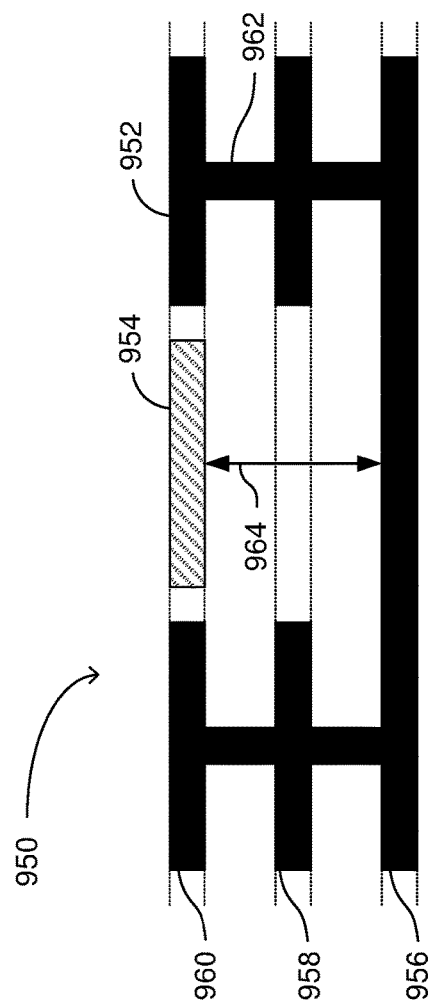

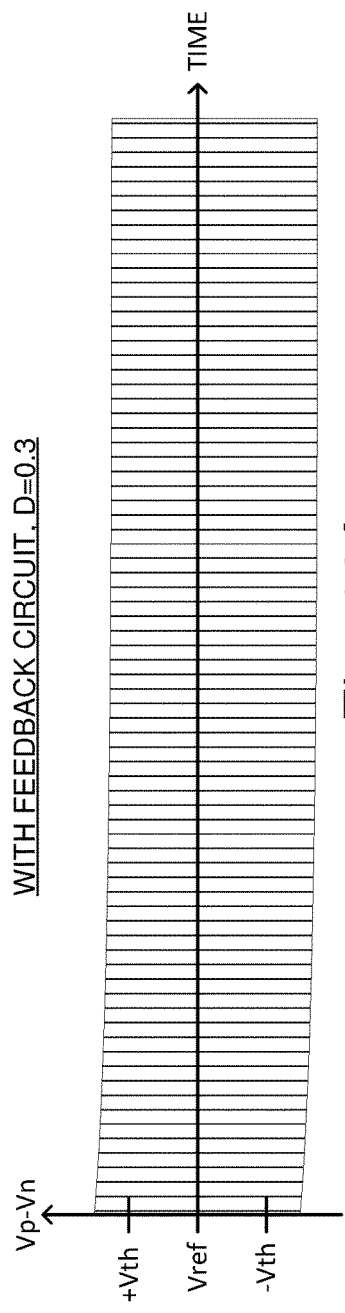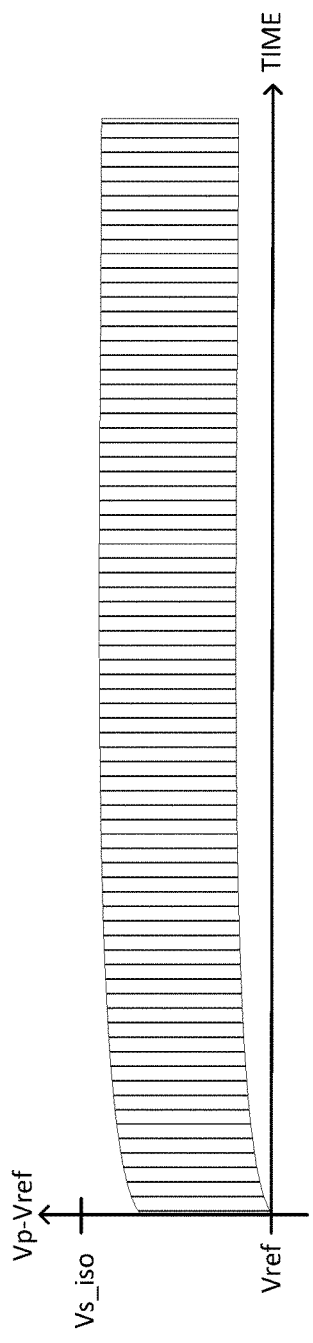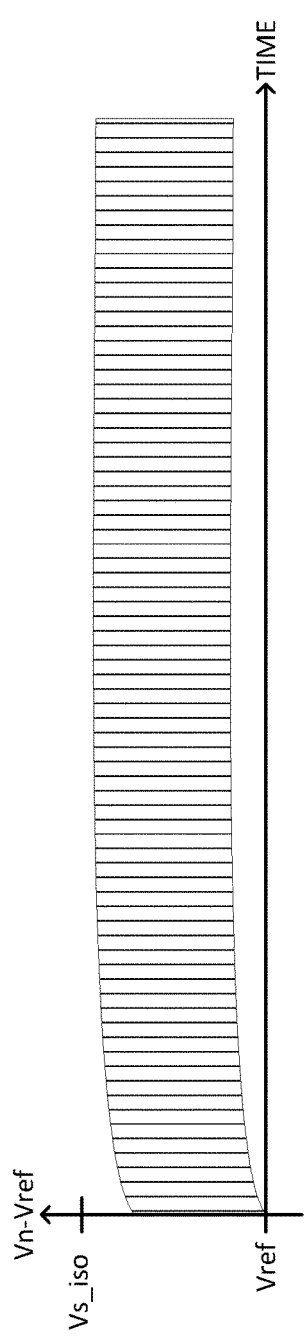

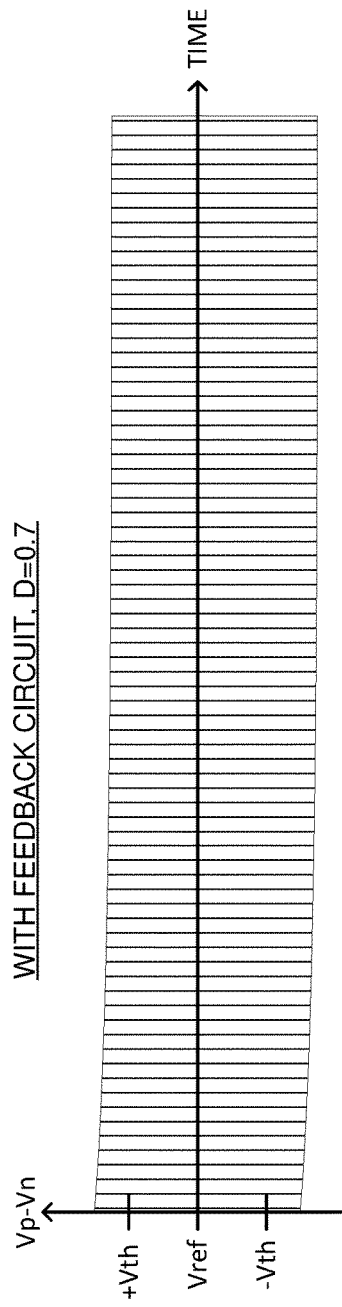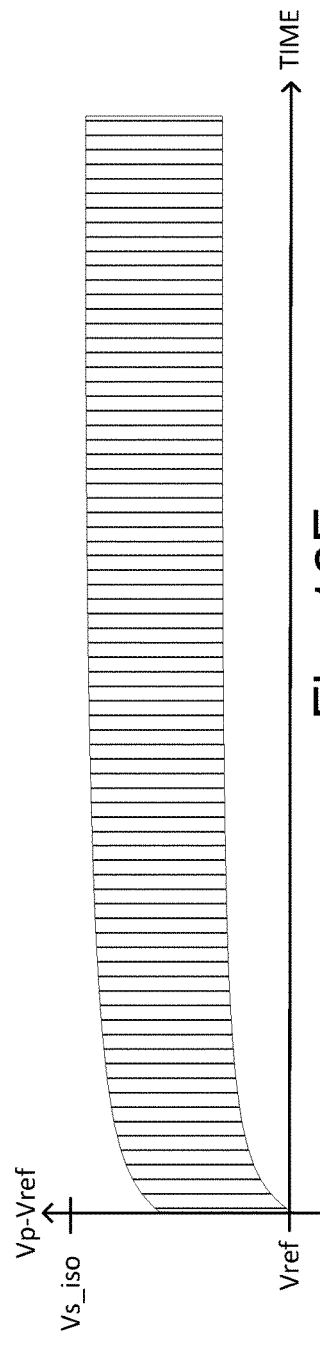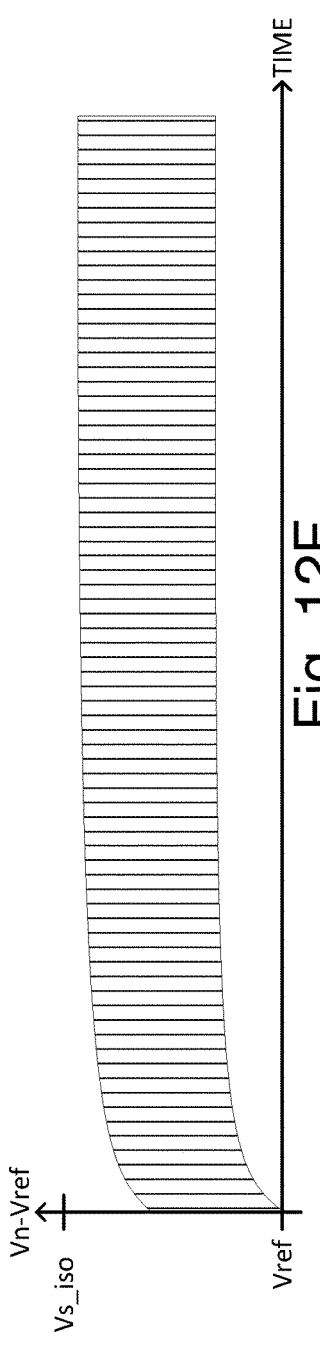

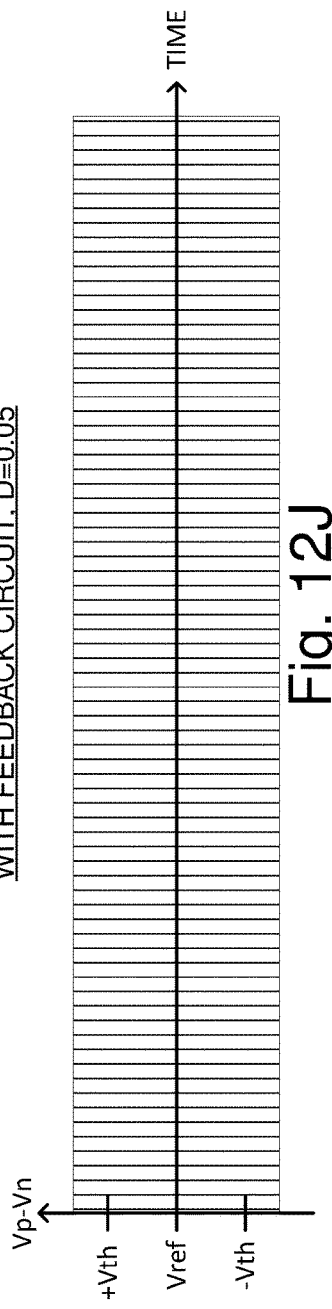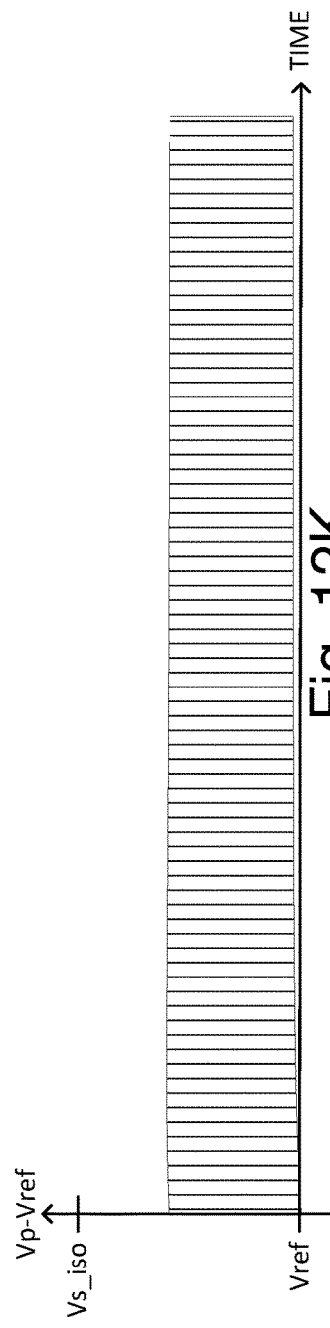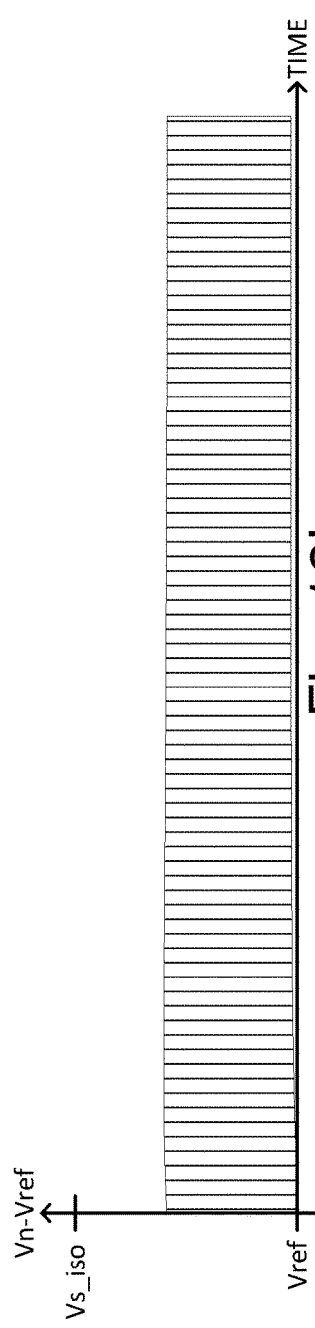

ISOLATED GATE DRIVER

CROSS-REFERENCE TO RELATED APPLICATIONS

This application is a non-provisional of and claims priority to U.S. Provisional Application No. 63/390,611, filed Jul. 19, 2022 and U.S. Provisional Application No. 63/436,242, filed Dec. 30, 2022, each of which are incorporated by reference herein in their entirety for all purposes.

FIELD OF THE DISCLOSURE

The disclosure relates generally to photovoltaic power systems. More specifically, the disclosure provides a system and method for regulating power production between power sources in a photovoltaic power system.

BACKGROUND OF THE DISCLOSURE

In the field of electronics, driver circuits (also referred to as 'gate drivers') may be employed to provide a signal for transitioning an electronic switch between states (e.g., between an 'on-state' in which the switch is conducting, and an 'off-state' in which the switch does not conduct). Examples of such switches may comprise transistors such as metal oxide semiconductor field effect transistors (MOSFETs), bipolar junction transistors (BJTs), insulated gate bipolar transistors (IGBTs), Gallium Nitride transistors, or Silicon Carbide (SiC) transistors. Regardless of the type of switch employed, a drive signal is required to cause the switch to transition between states. A gate driver may be configured to provide a signal to a control terminal of a switch (e.g., a gate terminal in a MOSFET, a Base terminal in a BJT). For example, in cases in which the switch is a MOSFET, the MOSFET includes a source terminal, a gate terminal, and a drain terminal. The state of the MOSFET may be controlled by applying a voltage to the gate terminal, relative to the source. Such a gate voltage may be on the order of several volts (e.g., 3V, 5V, 10V, 12V, 15V).

An example of an electronic device, in which a gate driver or gate drivers may be employed, may be a transistor half-bridge, which comprises two transistors coupled in series at a switching connection point. A connection point (e.g., may also be referred to as node) may be a connection between two or more electrical components (e.g., resistors, transistors, capacitors, inductors, diodes and the like). The series coupling of the two transistors may be connected across a voltage. For example, in cases in which n-type MOSFETS are employed, the source of a first transistor (also referred to as a 'high-side' transistor) may be coupled with the drain of a second transistor (also referred to as a 'low-side' transistor). The source of the low-side transistor may be coupled to a reference (e.g., ground), and the drain of the high-side transistor may be coupled with a voltage level (e.g., relative to the reference). In some cases, this voltage level may be tens, hundreds or even thousands of Volts. As such, while the voltage level required to drive high-side MOSFET, relative to the switch node, may be on the order of several volts, the voltage level required to drive high-side MOSFET, relative to the reference, may be one the order of tens or hundreds of volts.

A control signal for controlling the switches may be generated, for example, at a level of a few volts relative to the reference (e.g., 3.3V, 5V, 10V, or 12V relative to ground). A high-side gate driver may generate a voltage required to control the high-side switch relative to the switching node based on the control signal. However, as mentioned above, the switching node (e.g., which may be a reference of the high-side gate driver), may transition between zero volts, and tens or hundreds of volts relative to the reference. Such transitions may potentially damage the gate driver or preceding circuitry (e.g., due to currents and/or voltages above the ratings of circuit components). Therefore, the high-side gate driver may be isolated from preceding circuitry (e.g., to reduce the probability of fault to the gate driver or preceding circuitry). The terms 'isolated', AC-coupled, or DC-blocked are used herein interchangeably. For example, isolation of the high-side gate driver may be achieved using transformers, opto-couplers, capacitors, or Hall-effect sensors. The isolated gate driver may change the reference of the control signal (e.g., such that the switching node is the reference node of the control signal), and may further amplify the power of the control signal.

BRIEF SUMMARY OF THE DISCLOSURE

The following presents a simplified summary of the disclosure in order to provide a basic understanding of some aspects of the disclosure. This summary is not an extensive overview of the disclosure. It is not intended to identify key or critical elements of the disclosure or to delineate the scope of the disclosure. The following summary merely presents some concepts of the disclosure in a simplified form as a prelude to the more detailed description provided below.

A first aspect of the disclosure herein provides an isolated gate driver configured to provide a control signal to a control terminal of a switch. The isolated gate driver according to the disclosure herein may comprise an input stage for providing DC isolation for the gate driver, a comparator, and a feedback circuit. The comparator may compare a level of a first voltage with a level of a second voltage. In cases in which the first input voltage into the comparator may comprise two or more voltage levels, the output from the comparator may comprise two or more states, each of the at least two states may correspond to one of the at least two voltage levels. The feedback circuit may be configured to receive the output signal and set, based on the state of the output signal, the level of the first feedback voltage to one of the at least two voltage levels of the input voltage.

A second aspect of the disclosure herein provides a method for an isolated gate driver. In a first step a level of a first voltage at a first input, is compared by a comparator with a level of a second voltage at a second input. In a second step, a first feedback voltage is selected by a feedback circuit. In a third step, the first feedback voltage is applied to a first input of the comparator.

BRIEF DESCRIPTION OF THE DRAWINGS

A more complete understanding of the present disclosure and the advantages thereof may be acquired by referring to the following description in consideration of the accompanying drawings, in which like reference numbers indicate like features, and wherein:

FIGS. 9A and 9B, illustrate examples of implementing a capacitor using IC metal layers;

FIGS. 12A-12L illustrate examples of waveforms according to aspects of the disclosure herein.

DETAILED DESCRIPTION OF THE DISCLOSURE

In the following description of the various embodiments, reference is made to the accompanying drawings, which form a part hereof, and in which is shown by way of illustration various embodiments in which the disclosure may be practiced. It is to be understood that other embodiments may be utilized and structural and functional modifications may be made without departing from the scope of the present disclosure.

Aspects of the description herein relate to an isolated gate driver configured to provide a control signal to a control terminal of a switch (e.g., a gate of a MOSFET or IGBT, a base of a BJT). The gate driver according to the description herein is isolated, and may comprise a comparator, and a feedback circuit. The feedback circuit may control the voltage levels at the inputs of the comparator such that a change in voltage level of the input signal may result in a change in voltage level in the output of the comparator (e.g., the feedback circuit may control a differential voltage, a common mode voltage, or both differential and common mode voltage at the inputs of the comparator). The feedback circuit sets feedback voltages at the input terminals of the comparator, based on an output signal from the comparator, as further explained below. For example, a first input voltage into the comparator may comprise two or more voltage levels. The output from the comparator may comprise two or more states, each of the at least two states may correspond to one of the at least two voltage levels. The feedback circuit may be configured to receive the output signal and set, based on the state of the output signal, the level of the first feedback voltage to one of the at least two voltage levels of the input voltage.

Figure 1:
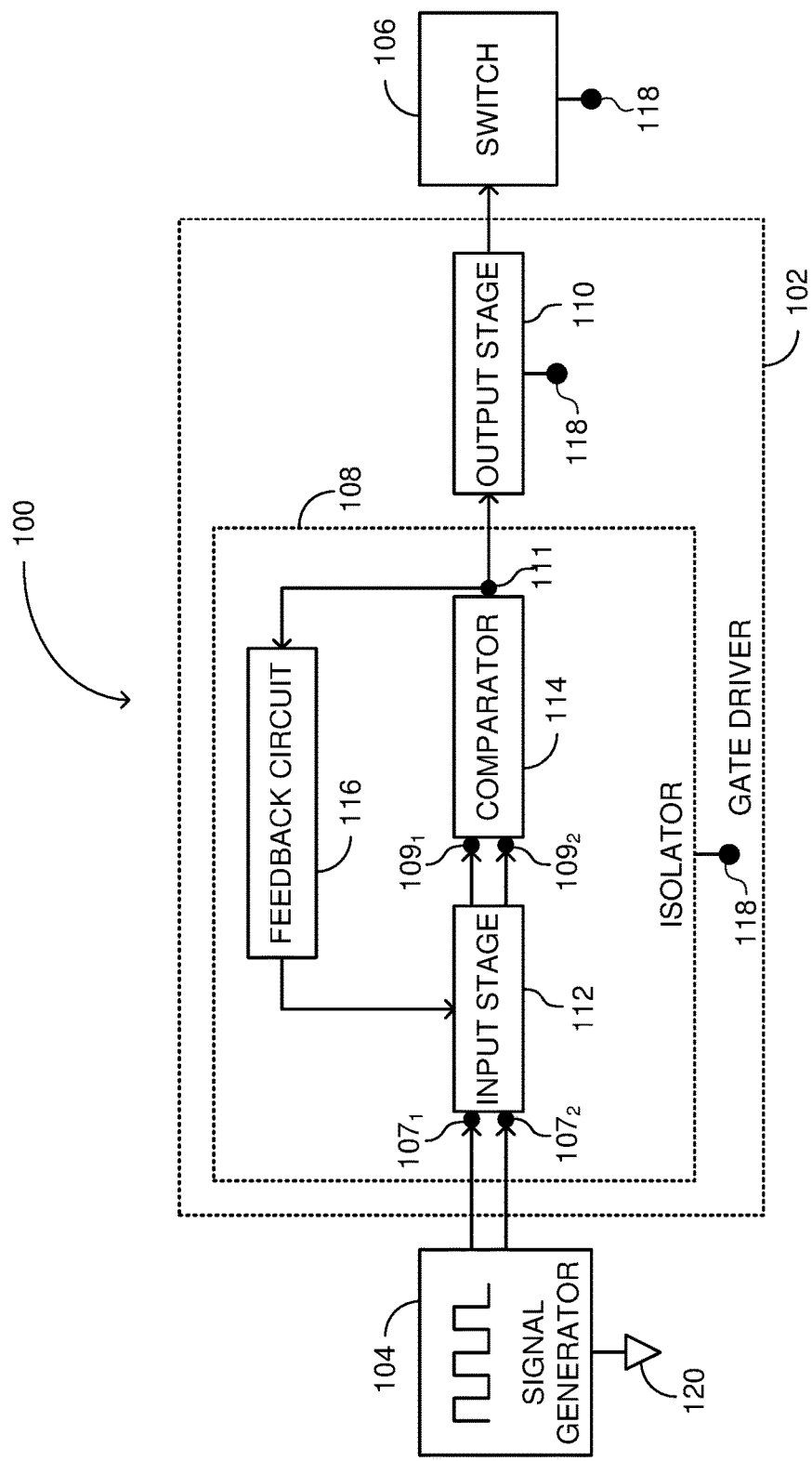
FIG. 1 illustrates a schematic illustration of an apparatus, in accordance with aspects of the disclosure.

Reference is now made to FIG. 1, which is a schematic illustration of an apparatus, generally referenced 100, in accordance with aspects of the disclosure. Apparatus 100 may comprise a gate driver 102, a signal generator 104 and a switch 106. Gate driver 102 may be an isolated gate driver, and may comprise an isolator 108, and an output stage 110. Isolator 108 may comprise an input stage 112, a comparator 114, and a feedback circuit 116. Outputs of signal generator 104 may be coupled with first and second inputs $107_1$ and $107_2$ of gate driver 100. Outputs of input stage 112 may be coupled to a third and a fourth inputs $109_1$ and $109_2$ of comparator 114. An output 111 of comparator 114 may be coupled to an input of output stage 110. Output stage 110 may be coupled to switch 106 (e.g., to a control terminal of switch 106). Feedback circuit 116 may be coupled to output 111 of comparator 114 and to input stage 114. Switch 106, isolator 108, and output stage 110 may be reference to a driver reference 118. Signal generator 104 may be reference to a signal reference 120. Driver reference 118 may be different from signal reference 120. Input stage 112 may comprise an AC coupler, or AC couplers, configured to DC isolate gate driver 102, at least from signal reference 120.

Signal generator 104 may generate an input signal (e.g., for controlling switch 106). The input signal may comprise two or more input voltage levels between first and second inputs $107_1$ and $107_2$ of gate driver 100. The two or more input voltage levels may correspond to at least two states of switch 106 (e.g., a conducting state, or a non-conducting state). The input signal is provided to comparator 114, via input stage 112, at third and fourth inputs $109_1$ and $109_2$ of comparator 114. The signal at third and fourth input $109_1$ and $109_2$ may comprise a level of a first voltage, relative to driver reference 118, at third input $109_1$, and a level of a second voltage, relative to driver reference 118, at the fourth input $109_2$. Input stage 112 is further elaborated below in conjunction with FIGS. 2A-2D, 3A-3D and 4. Comparator 114 may compare the level of a first voltage at third input $109_1$, and a level of a second voltage at the fourth input $109_2$, and provide, based on this comparison, an output signal at output 111. The output signal at node 111 may comprise at least two states, corresponding to the at least two voltage levels between third input $109_1$ and fourth input $109_2$. In some cases, both the first voltage level at third input $109_1$, and second voltage level at fourth input $109_2$, may transition between at least two levels. In some cases, the first voltage level at third input $109_1$ may transition between at least two levels, and the second voltage level at fourth input $109_2$ may remain constant.

Output stage 110 may amplify (e.g., a voltage or a power) the output signal from comparator 114, and provide the amplified output signal to a control terminal of switch 106. The amplified output signal may also comprise at least two states for controlling switch 106 (e.g., between a conducting state and a non-conducting state, or vice versa, or maintaining the current state of switch 106). Output stage 110 may further be elaborated below in conjunction with FIG. 6.

The output signal at output 111 of comparator 114 may also be provided to feedback circuit 116. Feedback circuit 116 may control the level of a first voltage at third input $109_1$, and a level of a second voltage at the fourth input $109_2$ such that a change in voltage level of the input signal may result in a change in voltage level in the output of comparator 114. For example, feedback circuit 116 may provide, based on the output signal, at least a first feedback voltage to input stage 112. For example, feedback circuit may provide a first feedback voltage to third input $109_1$, as further elaborated below in conjunction with FIGS. 2A-2D, 3A-3D and 4. Feedback circuit 116 may provide a second feedback voltage to fourth input $109_2$, also as further elaborated below in conjunction with FIGS. 2A-2D, 3A-3D and 4. For example, the level of the first feedback voltage may correspond to one of the at least two levels of the first voltage at third input $109_1$, relative to reference 118. The level of the second feedback voltage may correspond to the level of the second voltage at fourth input $109_2$, relative to reference 118.

In some cases, circuit 100 may be implemented on an Integrated Circuit (IC) employing, for example, CMOS techniques, and On-Chip metal connections (e.g., as elaborated in herein below in conjunction with FIGS. 9A and 9B).

Reference is made to FIGS. 2A-2D which shows an isolation circuit, generally referenced 200 and related diagrams, according to aspects of the description herein. Circuit 200 may comprise an isolator 202, and a signal generator 204. Isolator 202 may be part of a gate driver (e.g., gate driver 102—FIG. 1) and may correspond to isolator 108 (FIG. 1). Isolator 202, may comprise an input stage 206, a comparator 208 and a feedback circuit 210. The outputs of signal generator 204 may be coupled to inputs $224_1$ and $224_2$ of isolator 202. Signal generator 204 may be referenced to a signal reference 222.

Figure 2A:
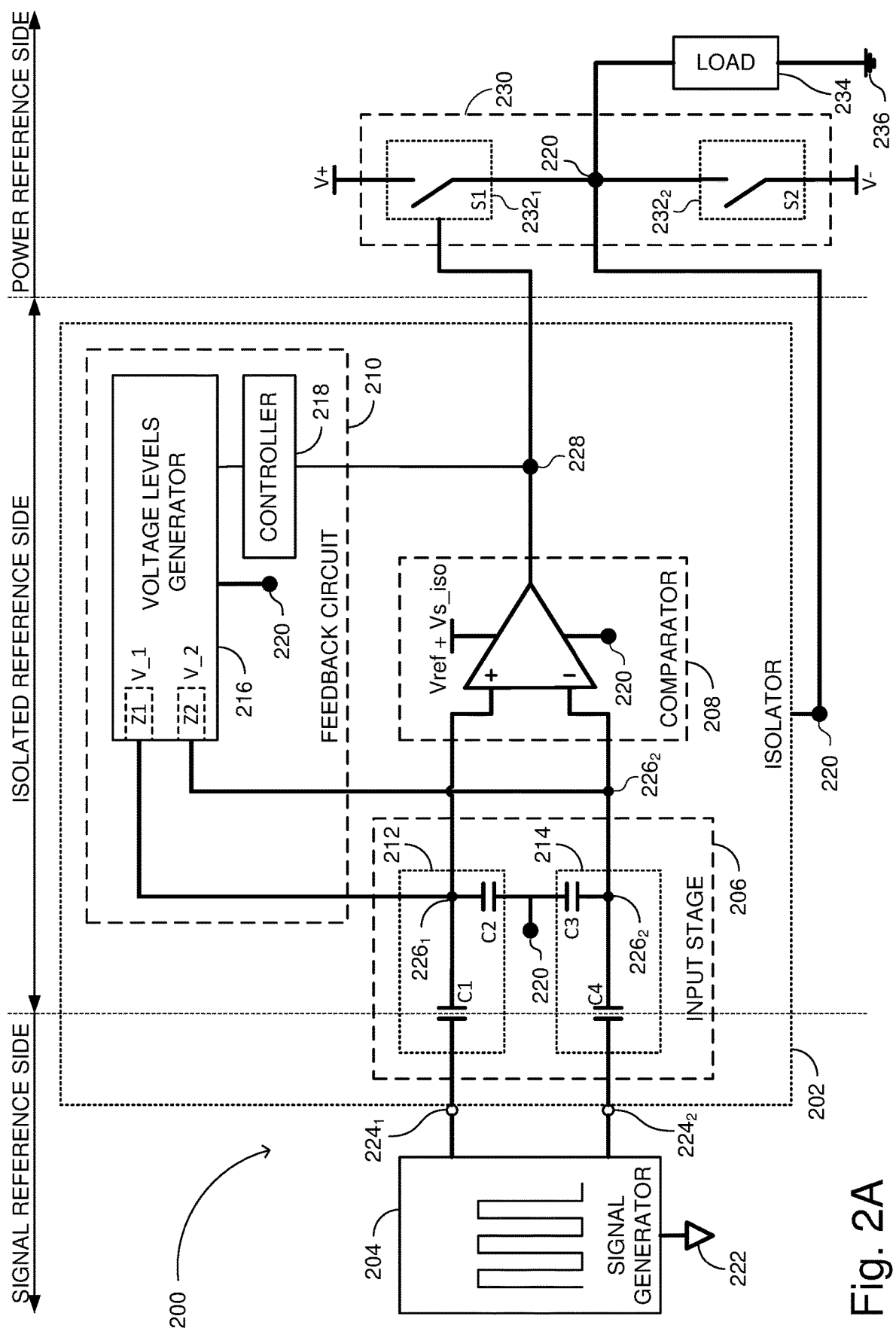
FIG. 2A illustrates an isolation circuit according to aspects of the description herein.

Input stage may comprise two AC couplers, a first AC coupler 212, and a second AC coupler 214. In the example of FIG. 2A, first AC coupler 212 may comprise a first impedance (e.g., capacitor C1) coupled between an input $224_1$ of circuit 200, and to a comparator input $226_1$ of comparator 208. First AC coupler 212 may further comprise a second impedance (e.g., capacitor C2), coupled between comparator input $226_1$ and a driver reference 220. The first impedance and the second impedance form a first impedance divider between input $224_1$ and driver reference 220. Second AC coupler 214 may comprise a third impedance (e.g., capacitor C3) coupled between an input $224_2$ of circuit 200, and a comparator input $226_2$ of comparator 208. Second AC coupler 214 may further comprise a fourth impedance (e.g., capacitor C4), coupled between comparator input $226_2$ and driver reference 220. The first impedance and the second impedance form a second impedance divider between input $224_1$ and driver reference 220. Additional examples of AC couplers may be described herein below in conjunction with FIGS. 10A-10D. Comparator 208 may be coupled between an isolated supply voltage Vs_iso, which is referenced to a reference voltage (referred to as 'Vref' in FIGS. 2B-2D), at driver reference 220. Using capacitors C2 and C3, as may be shown in FIG. 2A (and FIG. 4), may reduce the propagation delay of a gate driver according to aspects of the disclosure (e.g., relative to gate drivers in which resistors are used instead of C2 and C3—due to a reduce time constant). Also, the ratio between C2 and C1, and between C3 and C4, may aid in reducing transients in the signals at the inputs $226_1$ and $226_2$.

Feedback circuit 210 may comprise a voltage levels generator 216, and a controller 218. Feedback circuit may comprise two impedances Z1 and Z2. Controller 218 may be coupled to an output 228 of comparator 208, and to voltage levels generator 216. Voltage levels generator 216 may further be coupled to comparator input $226_1$, optionally, via impedance Z1. Voltage levels generator 216 may be coupled to comparator input $226_2$, optionally, via impedance Z2. Controller 212 may be implemented as a microcontroller, Field Programmable Gate Array (FPGA) or an Application Specific Integrated Circuit (ASIC) configured to carry out a set of control instructions.

The output 228 of comparator 208 may be coupled to a control terminal of a switch, such as switch $232_1$ (e.g., a MOSFET, an IGBT, a BJT). In the example of FIG. 2A, switch $232_1$ may be a high-side switch in a half-bridge converter 230. Half-bridge converter 230 may comprise switch $232_1$ and a switch $232_2$ (e.g., a MOSFET, an IGBT, a BJT), connected in series at a switching node, which may also correspond to driver reference 220 (e.g., the gate driver reference may be the switching node). The series connection of switch $232_1$ and switch $232_2$ may be coupled between a supply voltage, for example, as indicated by the labels 'V+' and 'V−' in FIG. 2A. A load 234 may be connected between driver reference 220 and a power reference 236. In cases in which switch $232_1$ is in a conducting state and switch $232_2$ is in a non-conducting state, the voltage of driver reference 220 may be V+. In cases in which switch $232_1$ is in a non-conducting stage and switch $232_2$ is in a conducting state, the voltage of driver reference 220 may be V−. In some cases, the difference between V+ and V− may be on the order of tens, hundreds or thousands of volts. Consequently, the voltage of driver reference 220 may vary, relative to power reference 236 or signal reference 222, by tens, hundreds or thousands of volts. According to aspects of the disclosure herein, V− may be coupled to power reference 236. In such a case voltage level V− is power reference 236.

Signal generator 204, may generate an input signal. For example, the input signal may be a Pulse Width Modulation (PWM) signal for controlling switch $232_1$. A duty cycle of the PWM signal may vary. The input signal may comprise two or more input voltage levels between inputs $224_1$ and $224_2$. The two or more input voltage levels may correspond to at least two states of switch $232_1$ (e.g., a conducting state, or a non-conducting state). The input voltage levels between inputs $224_1$ and $224_2$ may be between 0V and several volts (e.g., 3.3V, 5V, 7.5V, 10V, 12V, 15V, less than 50V). Signal generator 204 may provide the input signal to comparator inputs $226_1$ and $226_2$ via input stage 206. For example, the voltage at input $224_1$ may be provided to comparator input $226_1$ via AC coupler 212, and the voltage at input $224_2$ may be provided to comparator input $226_2$ via AC coupler 214.

Input stage 206 may provide DC isolation between driver reference 220 and signal reference 222. For example, capacitor C1 and C4 isolate a gate driver circuit 200, which may include isolator 202 (e.g., may also referred to as isolated reference side or floating reference side), from other system components of modules. In FIG. 2A, capacitor C1 and C4 isolate gated driver circuit 200 from the signal reference side (e.g., from generator 204). As such, the voltage levels in isolator 202 may be referenced to driver reference 220, the voltage levels from signal generator 204 may be referenced to signal reference 222, and the voltage levels in half bridge converter may be referenced to power reference 236. Therefore, even in cases in which switch $232_1$ is in the conducting state, and the voltage of driver reference 220 may be V+ (e.g., more than 100V, more than 1000V) relative to power reference 236, signal generator may generate the input voltage levels between inputs $224_1$ and $224_2$ to be between 0V and several volts. The voltage level between the output of the gate driver and driver reference 220 may also be on the order of several volts, for example, for changing the state of switch $232_1$.

Comparator 208 may compare the voltage level at comparator input $226_1$ with the voltage level at comparator input $226_2$ and provide an output signal at output 228 based on this comparison. This output signal is provided, either via an output stage (e.g., as further elaborated below in conjunction with FIG. 6) or directly, to the control terminal of switch $232_1$. The output signal from comparator 208 may comprise at least two states (e.g., a HIGH state, or a LOW state). For example, in cases in which the voltage level at comparator input $226_1$ is higher than the voltage level at comparator input $226_2$, the output signal from comparator 208 may be in a HIGH state. In cases in which the voltage level at comparator input $226_1$ is lower than the voltage level at comparator input $226_2$, the output signal from comparator 208 may be in a LOW state. In cases in which comparator 208 is an inverting comparator, the output signal from comparator 208 may be in a HIGH state, whereas the voltage level at comparator input $226_1$ is lower than the voltage level at comparator input $226_2$. The output signal from comparator 208 may be in a LOW state in cases in which the voltage level at comparator input $226_1$ is higher than the voltage level at comparator input $226_2$. Based on the output signal from comparator 208 being in a HIGH state, switch $232_1$ may transition to, or maintain a conducting state. Based on the output signal from comparator 208 being in a LOW state, switch $232_1$ may transition to, or maintain a non-conducting state. Comparator 208 may be implemented with an operational amplifier (Op-Amp) or Op-Amps, with digital gates (e.g., AND gates, OR gates, XOR gates), or discrete electronic components (e.g., transistors, diodes, or resistors).

Figure 2B:
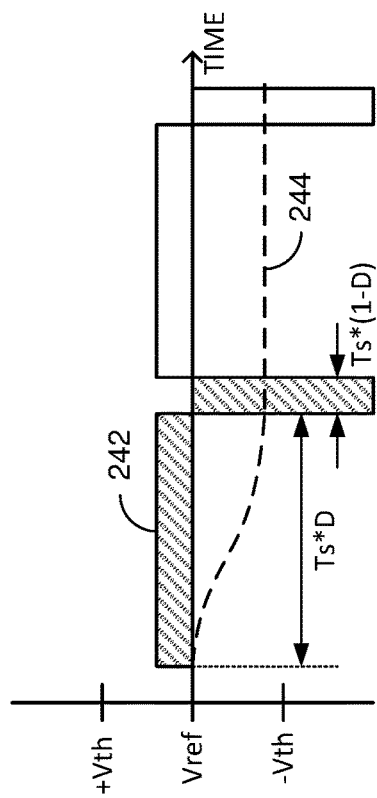
FIGS. 2B-2D illustrate examples of diagrams relating to a circuit according to aspects of the description herein.
Figure 2C:
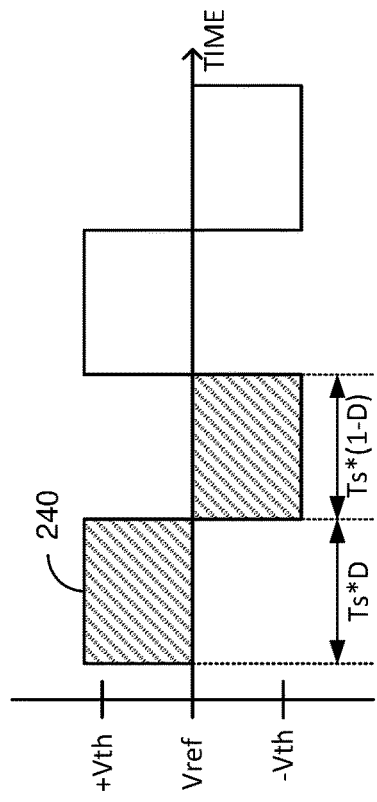
Figure 2D:
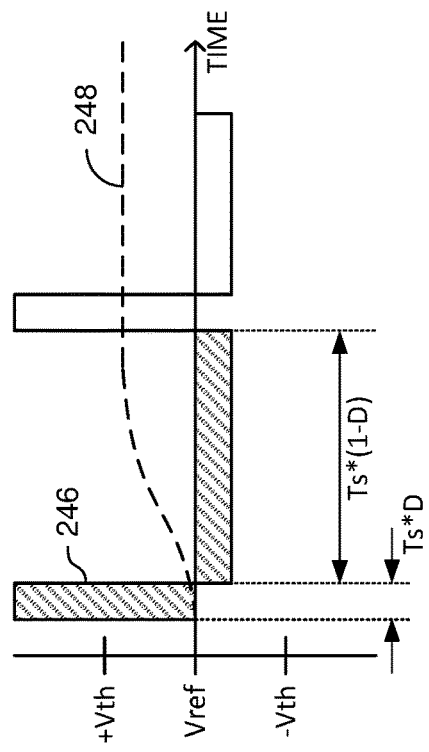

To reduce the probability of error at the output 228 of comparator 208, capacitors C2 and C3 may be charged to a determined voltage levels relative to driver reference 220. These voltage levels aim to enable comparator 208 to detect a difference between the voltage levels at comparator input $226_1$, and comparator input $226_2$. However, these voltage levels may change for various reasons. For example, leakage of charge from, or to capacitors C2 and C3 may cause these voltage levels to change (e.g., see the discussion concerning FIGS. 11A-11F below). The voltage levels at comparator input $226_1$, and comparator input 226 may change, for example, in cases in which signal generator 204 generates signals with a varying duty cycle (e.g., a PWM signal). In a case of a signal with varying duty cycle, the voltage levels of capacitors C2 and C3, relative to driver reference 220, may vary based on the duty cycle. Referring to FIGS. 2B-2D, these figures show signals 240, 242 and 246 from signal generator 208. Signals 240, 242 and 246 are of different duty cycles. Signal 240 has a duty cycle of 50%, signal 242 has a duty cycle larger than 50%, and signal 246 has a duty cycled smaller than 50%. FIGS. 2B-2D further depict signals 240, 242 and 246 relative to the voltage level at driver reference 220. FIGS. 2B-2D further depict signals 240, 242 and 246 relative to a positive threshold voltage, '+Vth', and a negative threshold voltage '-Vth', of the voltage difference between inputs $226_1$ and $226_2$ at comparator 208. +Vth, and -Vth relate to the voltage difference between the voltage levels at comparator input $226_1$, and comparator input $226_2$, which generate a HIGH state or a LOW state of the output signal at output 228 respectively. For example, +Vth may relate to a case in which the voltage level at comparator input $226_1$ is higher than the voltage level at comparator input $226_2$ (e.g., may be referred to as a positive difference between the voltage levels). -Vth may relate to a case in which the voltage level at comparator input $226_1$ is lower than the voltage level at comparator input $226_2$ (e.g., may be referred to as a negative difference between the voltage levels).

In FIG. 2B, signal 240 has a duty cycle of 50%. Signal 242 may rise above +Vth, or fall below -Vth. Thus, comparator 208 may detect a voltage difference between comparator input $226_1$, and comparator input $226_2$. In FIG. 2C, signal 242 has a duty cycle larger than 50%. Signal 242 may fall below -Vth, but not rise above +Vth. In such a case, comparator 208 may detect a negative difference but may not be able to detect a positive difference. In FIG. 2D, signal 246 has a duty cycle less than 50%. Signal 246 may rise above +Vth, but not fall below -Vth. In such a case, comparator 208 may detect a positive difference but may not be able to detect a negative difference. In FIGS. 2C and 2D, the effect of the duty cycle is depicted as a modulation of Vref. In FIG. 2C, Vref is depicted as increasing, relative to $226_1$. In FIG. 2D, Vref is depicted as decreasing, relative to $226_1$. For example, such a modulation of Vref may be due to the averaging of the PWM signal over capacitors C2 and C3.

A circuit according to aspects of the disclosure herein, may reduce the effect of varying duty cycle on the modulation of Vref, as well as leakage of charge from capacitors C1, C2, C3 or C4, by providing feedback voltage from feedback circuit 210. Feedback circuit 210 may control the level of a first voltage at input $226_1$, a level of a second voltage at the input $226_2$ or both, such that a change in voltage level of the input signal may result in a change in voltage level in a corresponding change the output 228 of comparator 208 (e.g., with a determined propagation delay). For example, feedback circuit 210 may control a differential voltage, a common mode voltage, or both differential and common mode voltage at input $226_1$ and $226_2$. Referring to FIG. 2A, based on an output of comparator 208, feedback circuit 210 may provide a first feedback voltage level 'V_1', relative to Vref, for comparator input $226_1$. Feedback circuit 210 may provide a second feedback voltage level 'V_2', relative to Vref, for comparator input $226_2$. According to aspects of the disclosure herein, controller 218 may generate a control signal for voltage levels generator 216, based on the output signal at output 228 of comparator 208. Voltage levels generator 216 generates, V_2, or both V_1 and V_2, based on a control signal from controller 218. V_2, or both V_1 and V_2, latch the input voltage of comparator 208, based on the output state (e.g., HIGH state or LOW state) of comparator 208. For example, in cases in which the output signal from comparator 208 is at a HIGH state, controller 218 may generate a control signal for voltage levels generator 216 to generate V_2, or both V_1 and V_2, such that the voltage at comparator input $226_1$ is higher than the voltage at comparator input $226_2$ (e.g., by charging or discharging C2, C3, or both via the respective impedances Z1 and Z2). In cases in which the output signal from comparator 208 is at a LOW state, controller 218 may generate a control signal for voltage levels generator 216 to generate V_2, or both V_1 and V_2, such that the voltage at comparator input $226_1$ is lower than the voltage comparator input $226_2$ (e.g., by charging or discharging C2, C3, or both via the respective impedances Z1 and Z2). Thus, with reference to FIGS. 2C and 2D, Vref may be maintained relative to input $226_1$ and input $226_2$, as depicted by dashed lines 244 and 248 respectively, at different duty cycles of the input signal.

According to aspects of the disclosure herein, voltage levels generator 216 may generate first feedback voltage level or second feedback voltage level V_2 to correspond to the input voltages at comparator inputs $226_1$ and $226_2$, which resulted in the state of the output signal. For example, input $224_2$ may be coupled with signal reference 222, and the voltage at input $224_1$ may vary between at least two levels relative to input $224_2$ (e.g., between 0V and 3.3V or 5V). In such a case, the voltage at input $226_2$ may be a constant voltage level relative to Vref at driver reference 220. The voltage at input $226_1$ may correspond to one of two levels, relative to the voltage at input $226_2$ (e.g., as may be determined by the capacitance values of C1, C2, C3 and C4). For example, in cases in which the voltage at input $226_2$ is a constant, this voltage may be referred to as 'common voltage', Vcm. The voltage at input $226_1$ may be a differential voltage, Vd, above or below the common voltage. For example, the voltage at input $226_1$ may be Vcm+Vd, or Vcm-Vd.

Voltage levels generator 216 may generate V_1 to correspond to the voltage level at input $226_1$, relative to Vref at driver reference 220, which resulted in the state of the output signal from comparator 208 (e.g., the state of comparator output 228). For example, in cases in which the voltage at input $226_2$ is a constant of 0.5V relative to Vref at driver reference 220 (e.g., Vcm=0.5), voltage levels generator 216 may generate V_2 to be 0.5V relative to Vref. In cases in which a voltage level at input $226_1$, that corresponds to a HIGH state at comparator output 228 is 0.65V relative to Vref (e.g., Vd=0.15V above V_2), voltage levels generator 216 may generate V_1 to be 0.65V relative to Vref, based on the state of the output signal at comparator output 228 being in a HIGH state. In cases in which a voltage level at input $226_1$ that corresponds to a LOW state at comparator output 228 is 0.35V relative to Vref (e.g., Vd=0.15V below V_2), voltage levels generator 216 may generate V_1 to be 0.35V relative to Vref, based on the state of the output signal at comparator output 228 being in a LOW state. For example, feedback circuit 210 latches the input voltage that generated the state of the output signal until a change may occur in the input signal. As further explained below in conjunction with FIGS. 12A-12L and 13A-13E, feedback circuit 210 may produce a modulated feedback voltage (e.g., modulated based on the input signal) to control the voltage levels at input $226_1$ and input $226_2$.

According to aspects of the disclosure herein, and as further elaborated below in conjunction with FIG. 3D, voltage levels generator 216 may comprise impedances such as Z1 and Z2. Impedances Z1 and Z2 may define, along with capacitors C1, C2, C3, and C4 a time constant or time constants. Such a time constant may be related to a rate of change of the voltage at inputs $226_1$ and $226_2$, which may result in a response time of voltages at inputs $226_1$ and $226_2$ to the generation of V_1 and V_2 by voltage levels generator 216. For example, with reference to FIGS. 2C and 2D, dashed lines 244 and 248 illustrate the response of the voltage Vref at driver reference 220, relative to the voltage at input $226_1$, based on the applied feedback voltage, and the impedances Z1 and Z2. As seen in FIGS. 2C and 2D, Vref may respond to the applied feedback voltage over a response time.

Similar to as mentioned above, in some cases, isolator 202 may be implemented on an Integrated Circuit (IC) employing, for example, CMOS techniques and On-Chip metal connections. For example, capacitors C1, C2, C3 and C4 may be implemented by the metals employed in the IC, as in the examples in FIGS. 9A and 9B.

Figure 3B:
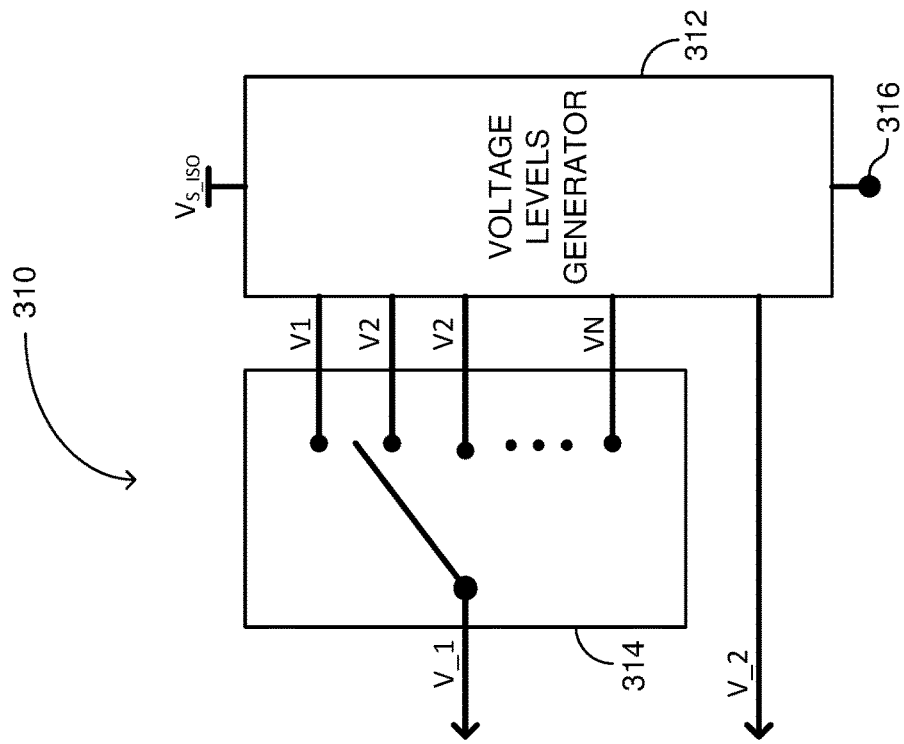
FIGS. 3A-3D illustrate examples of voltage levels generator according to aspects of the disclosure herein.
Figure 3A:
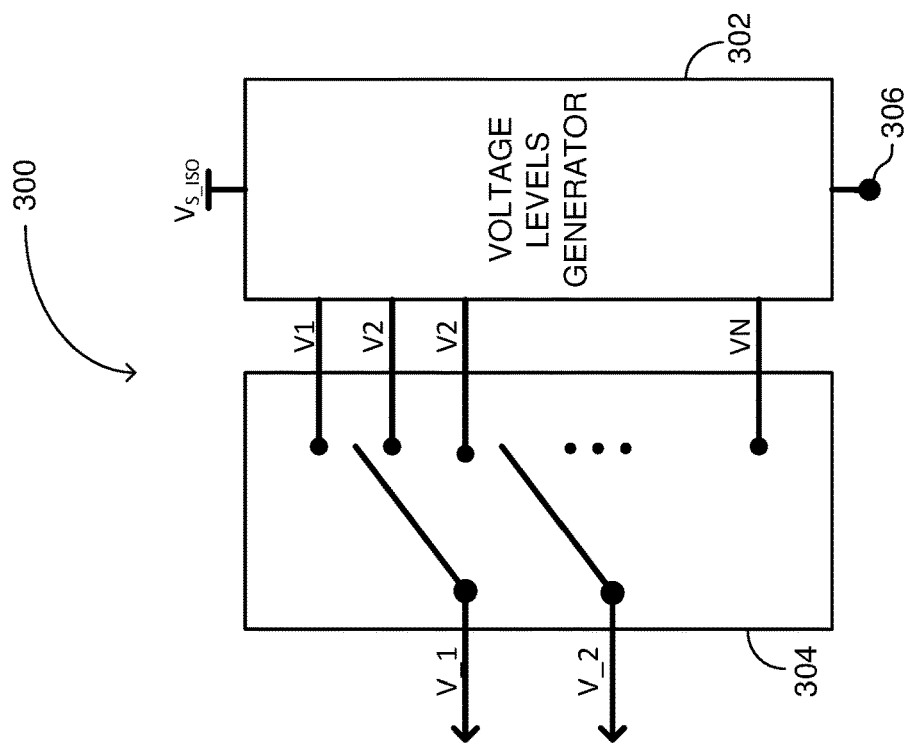

Reference is now made to FIGS. 3A-3D, which illustrate examples of voltage levels generator, such as voltage levels generator 216 (FIG. 2A), and still referring to FIG. 2A. FIG. 3A illustrates a voltage levels generator, generally referenced 300, which may comprise a voltage levels generator 302, and a double pole multi-throw switch 304. Voltage levels generator 302 may be coupled between an isolated supply voltage, Vs_iso, and reference 306. Voltage levels generator 302 may generate a plurality of voltages V1-VN. Controller 218 (FIG. 2A), may operate double pole multi-throw switch 304 to select V_1 and V_2, based on the output from comparator 208 at comparator output 228.

FIG. 3B illustrates a voltage levels generator, generally referenced 310, which may comprise a voltage levels generator 312, and a single pole multi-throw switch 314. Voltage levels generator 312 may be coupled between an isolated supply voltage, $V_{S\_ISO}$ and reference 316. Voltage levels generator 310 may be employed, in cases in which V_2 is constant. In such a case, voltage levels generator 312 may generate V_2, as well as a plurality of voltages V1-VN. Controller 218 may operate single pole multi-throw switch 314 to select V_1. For example, V_2 may be set to the common voltage Vcm and V_1 may be selected to be various values above or below Vcm.

Figure 3D:
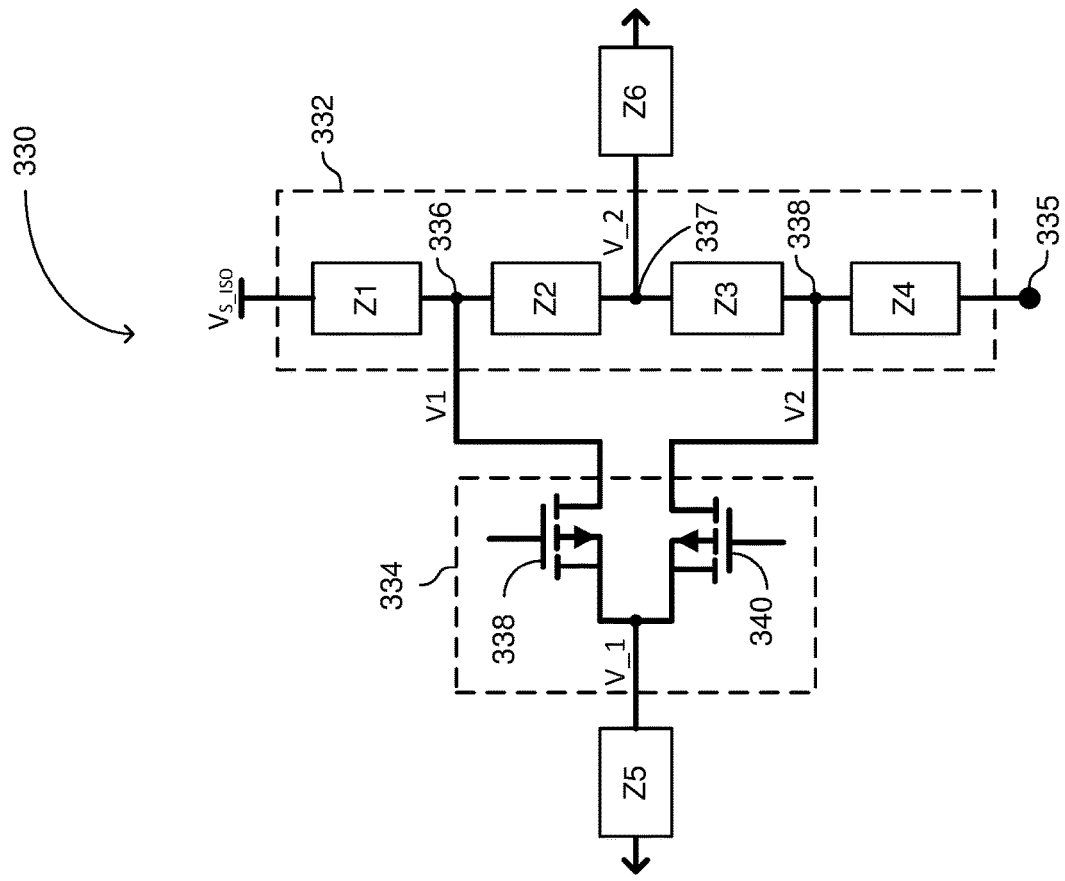
Figure 3C:
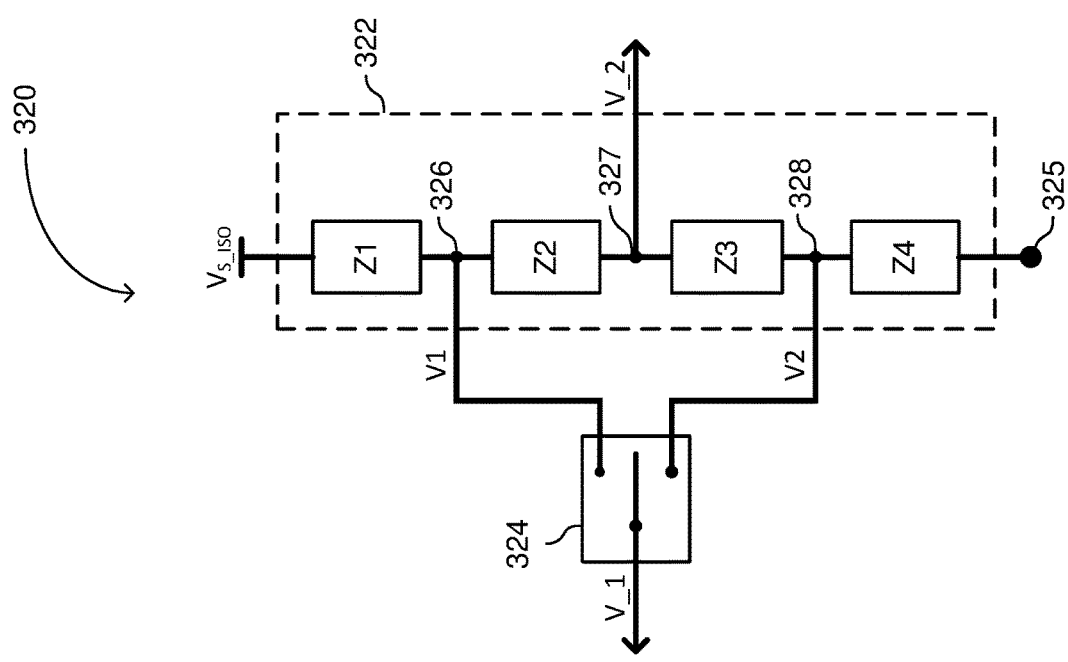

FIG. 3C illustrates an example of voltage levels generator, generally referenced 320. Voltage levels generator 320 may comprise a voltage levels generator 322, and a single pole double throw switch 324. In FIG. 3C, voltage levels generator 322 may be implemented by an impedance divider. Voltage levels generator 322 may comprise four impedances Z1, Z2, Z3, and Z4 coupled in series. Z1 may be coupled to Z2 at connection point 326. Z2 may be coupled to Z3 at connection point 327, and Z3 may be coupled to Z4 at connection point 328. The series coupling of impedances Z1-Z4 may be coupled between an isolated supply voltage, 'Vs_iso', and a reference 325 (e.g., which may correspond to reference 220). Voltage levels generator 322 may generate a constant V_2 at connection point 327 between Z2 and Z3. Voltage levels generator 322 may generate a V_1 to be either V_1 at connection point 326 between Z1 and Z2, or V2 at connection point 328 between Z3 and Z4. Connection point 326 may be coupled to a first input of single pole double throw switch 324. Connection point 328 may be coupled to a second input of single pole double throw switch 324. Controller 218 may control switch 324 to select either V_1 or V2, as the first feedback voltage V_1.

FIG. 3D illustrates an example of voltage levels generator, generally referenced 330. Voltage levels generator 330 may comprise a voltage levels generator 332, and a single pole double throw switch 334. In FIG. 3D, voltage levels generator 332 may be implemented by an impedance divider, and single pole double throw switch 334 may be implemented with switches 338 and 340 (depicted as two MOSFETS in FIG. 3D). Voltage levels generator 332 may comprise four impedances Z1, Z2, Z3, and Z4 coupled in series. Z1 may be coupled to Z2 at connection point 336. Z2 may be coupled to Z3 at connection point 337, and Z3 may be coupled to Z4 at connection point 338. The series coupling of impedances Z1-Z4 may be coupled between an isolated supply voltage 'Vs_iso', and a reference connection point 335 (e.g., which may correspond to reference 220). Voltage levels generator 332 may generate a constant V_2 from the voltage at connection point 337 between Z2 and Z3, applied over an impedance Z6 coupled to connection point 337. Impedance Z6 may correspond to impedance Z2 in FIG. 2A. Voltage levels generator 332 may generate a V_1 to be either V_1 at connection point 336 between Z1 and Z2, or V2 at connection point 338 between Z3 and Z4, applied over an impedance Z5 coupled to the output of switch 334. Impedance Z5 may correspond to impedance Z1 in FIG. 2A. Connection point 336 may be coupled to a first input of single pole double throw switch 334. Connection point 338 may be coupled to a second input of single pole double throw switch 334. Controller 218 may control switch 334 to select V_1, applied over Z5, by controlling switch 338 to be in a conducting state, and controlling switch 340 to be in a non-conducting state. Controller 218 may control switch 334 to select V2, applied over Z5, as V_1 by controlling switch 338 to be in a non-conducting state, and controlling switch 340 to be in a conducting state.

According to aspects of the disclosure a voltage levels generator such as described above in conjunction with FIGS. 1, 2A, 3A-3D, may be implemented as a Digital to Analog Converter.

A gate driver according to aspects of the disclosure, may comprise a sensor for sensing the voltage between the driver reference (e.g., reference 220—FIG. 2A), and either a power reference (e.g., power reference 236—FIG. 2), or signal reference (e.g., signal reference 222—FIG. 2), or both. In some cases, the power reference and the signal reference may be one and the same. Sensing the voltage between the driver reference, and at least one of the power reference, or the signal reference may provide information, for example, relating to discrepancies between the state of the output of the comparator, and the state of either the signal generator or the half bridge converter.

Figure 4:
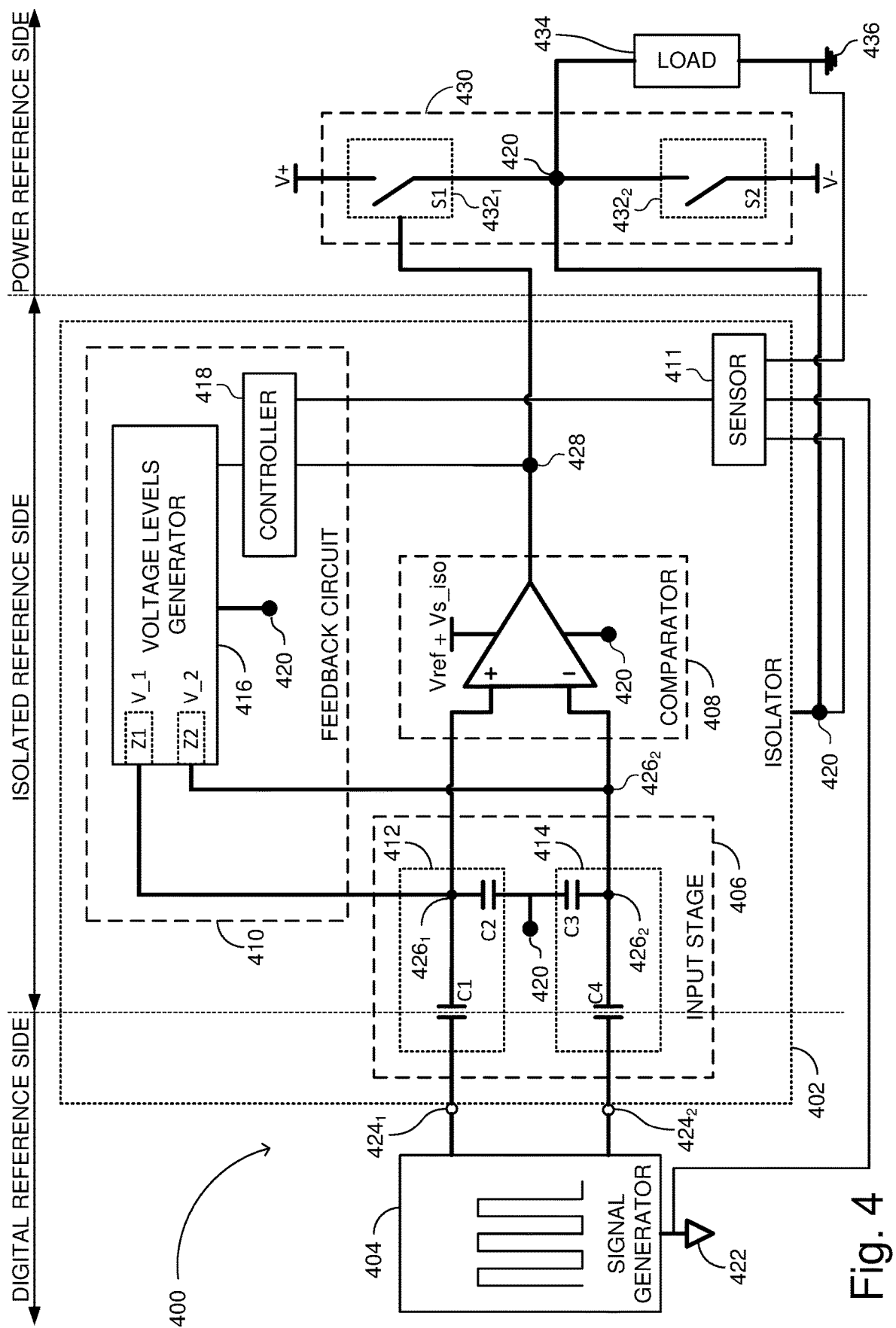
FIG. 4 illustrates an isolation circuit according to aspects of the disclosure herein.

Reference is now made to FIG. 4, which illustrates an isolation circuit, generally referenced 400, according to aspects of the description herein. Circuit 400 may be similar to circuit 200 (FIG. 2A), and may be a part of an isolated gate driver. Circuit 400 may comprise an isolator 402, and a signal generator 404. Isolator 402 may comprise an input stage 406, a comparator 408, a feedback circuit 410, and a sensor 411. The outputs of signal generator 404 may be coupled to inputs $424_1$ and $424_2$ of isolator 402. Signal generator 404 may be referenced to a signal reference 422.

Input stage may comprise two AC couplers, a first AC coupler 412, and a second AC coupler 414. In the example of FIG. 4, first AC coupler 412 and second AC coupler 414 are similar to first AC coupler 212 and second AC coupler 214 (FIG. 2A). Additional examples of AC couplers may be described herein below in conjunction with FIGS. 10A-10D. First AC coupler 412 may comprise a first impedance (e.g., capacitor C1) coupled between an input $424_1$ of circuit 400, and to a comparator input $426_1$ of comparator 408. First AC coupler 412 may further comprise a second impedance (e.g., capacitor C2), coupled between comparator input $426_1$ and a driver reference 420. The first impedance and the second impedance form a first impedance divider between input $424_1$ and driver reference 420. Second AC coupler 414 may comprise a third impedance (e.g., capacitor C3) coupled between an input $424_2$ of circuit 400, and a comparator input $426_2$ of comparator 408. Second AC coupler 414 may further comprise a fourth impedance (e.g., capacitor C4), coupled between comparator input $426_2$ and driver reference 420. The first impedance and the second impedance form a second impedance divider between input $424_1$ and driver reference 420. Comparator 408 may be coupled between an isolated supply voltage Vs_iso, which is referenced to a reference voltage (referred to as 'Vref' in FIG. 4), at driver reference 420.

Feedback circuit 410 may comprise a voltage levels generator 416, and a controller 418. Feedback circuit may comprise two impedances Z1 and Z2. Controller 418 may be coupled to a comparator output 428 of comparator 408, and to voltage levels generator 416. Voltage levels generator 416 may further be coupled to comparator input $426_1$, optionally, via impedance Z1. Voltage levels generator 416 may be coupled to comparator input $226_2$, optionally, via impedance Z2. Voltage levels generator 416 may be similar to voltage level generators 300, 310, 320, or 330 described above in conjunction with FIGS. 3A-3D. Controller 412 may be implemented as a microcontroller, a Field Programmable Gate Array (FPGA) or an Application Specific Integrated Circuit (ASIC) configured to carry out a set of control instructions.

The comparator output 428 may be coupled to a control terminal of a switch, such as switch $432_1$ (e.g., a MOSFET, an IGBT, a BJT). Similar to the example in FIG. 2A, switch $432_1$ may be a high-side switch in a half-bridge converter 430. Half-bridge converter 430 may comprise switch $432_1$ and a switch $432_2$ (e.g., a MOSFET, an IGBT, a BJT) connected in series at a switching node, which may also correspond to driver reference 420. The series connection of switch $432_1$ and switch $432_2$ may be coupled between a supply voltage, for example, as indicated by the labels 'V+' and 'V−'. A load 434 may be connected between driver reference 420 and a power reference 436. In cases in which switch $432_1$ is in a conducting state and switch $432_2$ is in a non-conducting state, the voltage of driver reference 420 may be V+. In cases in which switch $432_1$ is in a non-conducting state and switch $432_2$ is in a conducting state, the voltage of driver reference 420 may be V−. In some cases, the difference between V+ and V− may be on the order of tens, hundreds or thousands of volts. Consequently, the voltage of driver reference 420 may vary, relative to power reference 436 or signal reference 422, by tens, hundreds or thousands of volts. According to aspects of the disclosure herein, V− may be coupled to power reference 436. In such a case voltage level V− is power reference 436.

Signal generator 404, may generate an input signal. For example, the input signal may be a Pulse Width Modulation (PWM) signal for controlling switch $432_1$. A duty cycle of the PWM signal may vary. The input signal may comprise two or more input voltage levels between inputs $424_1$ and $424_2$. The two or more input voltage levels may correspond to at least two states of switch $432_1$ (e.g., a conducting state, or a non-conducting state). The input voltage levels between inputs $424_1$ and $424_2$ may be between 0V and several volts (e.g., 3.3V, 5V, 7.5V, 10V, 12V, 15V, less than 50V). Signal generator 404 may provide the input signal to comparator inputs $426_1$ and $426_2$ via input stage 406. For example, the voltage at input $424_1$ may be provided to comparator input $426_1$ via AC coupler 412, and the voltage at input $424_2$ may be provided to comparator input $426_2$ via AC coupler 414.

Input stage 406 may provide DC isolation between driver reference 420 and signal reference 422. For example, capacitor C1 and C4 isolate a gate driver circuit which may include isolator 402 (e.g., may also referred to as isolated reference side or floating reference side), from other system components of modules. In FIG. 4, capacitor C1 and C4 isolate gated driver circuit 400 from the signal reference side (e.g., from generator 404). As such, the voltage levels in isolator 402 may be referenced to driver reference 420, the voltage levels from signal generator 404 may be referenced to signal reference 422, and voltage levels in half bridge converter may be referenced to power reference 436. Therefore, even in cases in which switch $432_1$ is in the conducting state, and the voltage of driver reference 420 may be V+(e.g., more than 100V, more than 1000V) relative to power reference 436, signal generator may generate the input voltage levels between inputs $424_1$ and $424_2$ to be between 0V and several volts. The voltage level between the output of the gate driver and driver reference 420 may also be on the order of several volts, for example, for changing the state of switch $432_1$.

Comparator 408 may compare the voltage level at comparator input $426_1$ with the voltage level at comparator input $426_2$, and provide an output signal at comparator output 228 based on this comparison. This output signal is provided, either via an output stage (e.g., as further elaborated below in conjunction with FIG. 6) or directly, to the control terminal of switch $432_1$. The output signal from comparator 408 may comprise at least two states (e.g., a HIGH state, or a LOW state). For example, in cases in which the voltage level at comparator input $426_1$ is higher than the voltage level at comparator input $426_2$, the output signal from comparator 408 may be in a HIGH state. In cases in which the voltage level at comparator input $426_1$ is lower than the voltage level at comparator input $426_2$, the output signal from comparator 408 may be in a LOW state. In cases in which comparator 408 is an inverting comparator, the output signal from comparator 408 may be in a HIGH state, whereas the voltage level at comparator input 426₁ is lower than the voltage level at comparator input 426₂. The output signal from comparator 408 may be in a LOW state in cases in which the voltage level at comparator input 426₁ is higher than the voltage level at comparator input 426₂. Based on the output signal from comparator 408 being in a HIGH state, switch 432₁ may transition to, or maintain a conducting state. Based on the output signal from comparator 408 being in a LOW state, switch 432₁ may transition to, or maintain a non-conducting state.

Similar to as described above in conjunction with FIGS. 2A-2D, to reduce the probability of error at comparator output 428 of comparator 408, capacitors C2 and C3 may be charged to a determined voltage levels relative to driver reference 420. Feedback circuit 410 may control the level of a first voltage at input 426₁, and a level of a second voltage at the input 426₂ such that a change in voltage level of the input signal may result in a corresponding change in voltage level in the output 428 of comparator 408 (e.g., with a determined propagation delay). For example, feedback circuit 410 may control a differential voltage, a common mode voltage, or both differential and common mode voltage at input 426₁ and 426₂. These voltage levels aim to enable comparator 408 to detect a difference between the voltage levels at comparator input 426₁ and comparator input 426₂. However, these voltage levels may change for various reasons (e.g., leakage of charge from or to capacitors C2 and C3, or varying PWM signal from signal generator 404). A circuit according to aspects of the disclosure herein may reduce the effect of varying duty cycle on the modulation of Vref, as well as leakage of charge from capacitors C1, C2, C3 or C4, by providing feedback voltage from feedback circuit 410. For example, based on an output of comparator 408, feedback circuit 410 may provide a first feedback voltage level 'V_1', relative to Vref, for comparator input 426₁. Feedback circuit 410 may provide a second feedback voltage level 'V_2', relative to Vref, for comparator input 426₂. According to aspects of the disclosure herein, controller 418 may generate a control signal for voltage levels generator 416, based on the output signal at comparator output 428. Voltage levels generator 416 generates V_2, or both V_1 and V_2, based on a control signal from controller 418. V_2, or both V_1 and V_2, latch the input voltage of comparator 408, based on the output state (e.g., HIGH state or LOW state) of comparator 208. For example, in cases in which the output signal from comparator 408 is at a HIGH state, controller 418 may generate a control signal for voltage levels generator 416 to generate V_2, or both V_1 and V_2, such that the voltage at comparator input 426₁ is higher than the voltage at comparator input 426₂. In cases in which the output signal from comparator 408 is at a LOW state, controller 418 may generate a control signal for voltage levels generator 416 to generate V_2, or both V_1 and V_2, such that the voltage at comparator input 426₁ is lower than the voltage comparator input 426₂.

Similar to as described above in conjunction with FIG. 2A, voltage levels generator 416 may generate first feedback voltage level or second feedback voltage level V_2 to correspond to the input voltages at comparator inputs 426₁ and 426₂, which resulted in the state of the output signal. For example, input 424₂ may be coupled with signal reference 422, and the voltage at input 424₁ may vary between at least two levels relative to input 424₂ (e.g., between 0V and 3.3V or 5V). In such a case, the voltage at comparator input 426₂ may be a constant voltage level relative to the voltage at driver reference 420. The voltage at comparator input 426₁ may correspond to one of two levels, relative to the voltage at comparator input 426₂ (e.g., as may be determined by the capacitance values of C1, C2, C3 and C4). Voltage levels generator 416 may generate V_1 to correspond to the voltage level at comparator input 426₁, relative to the voltage at driver reference 420, which resulted in the current state of the output signal from comparator 408. For example, in cases in which the voltage at comparator input 426₂ is a constant of 0.5V relative to the voltage at driver reference 420, voltage levels generator 416 may generate V_2 to be 0.5V relative to Vref. In cases in which a voltage level at comparator input 426₁, that corresponds to a HIGH state at comparator output 428 is 0.75V relative to the voltage at driver reference 420, voltage levels generator 416 may generate V_1 to be 0.75V relative to the voltage at driver reference 420, based on the state of the output signal at comparator output 428 being in a HIGH state. In cases in which a voltage level at comparator input 426₁, that corresponds to a LOW state at comparator output 428 is 0.25V relative to Vref, voltage levels generator 416 may generate V_1 to be 0.25V relative to Vref, based on the state of the output signal at comparator output 428 being in a LOW state. For example, feedback circuit 410 latches the input voltage that generated the state of the output signal.

As mentioned above, circuit 400 may comprise a sensor 411 coupled to controller 418, and to driver reference 420. Sensor 411 may further be coupled to either power reference 436, or signal reference 422, or both. In some cases, power reference 436 and signal reference 422 may be one and the same. According to embodiments of the disclosure herein, sensor 411 may be coupled between comparator input 426₁ and driver reference 420 (e.g., across capacitor C2). Sensor 411 may be a voltage sensor and may be implemented by employing a resistive or capacitive divider, a resistive or capacitive bridge, comparators (e.g., employing operational amplifiers), or the like. Sensor 411 may be configured to measure the voltage between driver reference 420 and power reference 436, between driver reference 420 and signal reference 422, or between driver reference 420 and both power reference 436 and signal reference 422.

Sensing (e.g., by sensor 411) the voltage between driver reference 420, and at least one of the power reference 436, or the signal reference 422, may provide information, for example, relating to discrepancies between the state of the output of comparator 408, and the state of either signal generator 404 or half bridge converter 430. For example, based on a measurement of the voltage between driver reference 420 and power reference 436 from sensor 411, controller 418 may detect that the output of comparator 408 is at a HIGH state, but the voltage between driver reference 420 and power reference 436 may indicate that the output of comparator 408 should be in a LOW state (or vice versa). In cases in which controller 418 detects a discrepancy, or an unexpected change between the voltages of driver reference 420 and signal reference 422, or between driver reference 420 and power reference 436, controller 418 may output a previously determined control signal.

It can be shown that:

$$V_p - V_{ref} = \frac{C1}{C1+C2} V_{PWM} - \frac{C1}{C1+C2} V_{ref} + V_{p,0} \tag{1}$$

$$V_n - V_{ref} = -\frac{C4}{C4+C3} V_{ref} + V_{n,0} \tag{2}$$

where '$V_p$' is a voltage at comparator input $426_1$, $V_{ref}$ is the voltage at driver reference 420 (e.g., relative to signal reference 422), and '$V_{p,0}$' is the voltage at comparator input $426_1$ at a time t=0. '$V_n$' is a voltage at comparator input $426_2$, and '$V_{n,0}$' is the voltage at comparator input $426_2$ at a time t=0. As can be seen from Equation (1), $V_p$-$V_{ref}$ may increase or decrease depending on $V_{ref}$ and on C2. As can be seen from Equation (2), $V_n$-$V_{ref}$ may increase or decrease depending on $V_{ref}$ and on C3. From equations (1) and (2), $V_p$-$V_n$ (e.g., the input to comparator 402) depends on C2, C3, and $V_{ref}$. A change in $V_{ref}$ may affect the output of comparator 408 (e.g., in some cases, $V_p$-$V_n$ voltage reduces to a level at which comparator 408 does not respond). In the example of FIG. 4, $V_{ref}$ may change to be either V− or V+ of Half-bridge converter 430. C2 or C3 may be selected to allow for such variations in $V_{ref}$, while maintaining $V_n$-$V_p$ at a range in which comparator 408 may respond.

According to aspects of the disclosure herein, the common voltage, Vcm, may be selected based on changes to $V_{ref}$. Adjusting the common voltage based on $V_{ref}$ may allow for selection of C2 and C3 such that $V_p$-$V_n$ may increase (e.g., thus improving the signal to noise ratio). According to aspects of the disclosure herein, sensor 411 may measure a voltage between reference 420 and signal reference 422. Controller 418 may control voltage levels generator 416 to set a voltage at comparator input $426_2$ based on this measured voltage. For example, controller 418 may control voltage levels generator 416 to set a voltage at comparator input $426_2$ to be one of two voltage levels relative to $V_{ref}$ (e.g., Vcm is set to one of two levels relative to Vref, Vcm1, or Vcm2). Controller 418 may control voltage levels generator 416 to set a differential voltage at comparator input $426_1$ to be one of two voltage levels relative to the Vref (e.g., Vd above Vcm1 or Vcm2, or Vd below Vcm1 or Vcm2). For example, with reference to FIG. 3A, controller 418 may control voltage levels generator 300 to generate V_1 and V_2 based on the output from comparator 408, and based on a measurement from sensor 411 of the voltage between driver reference 420 and signal reference 422. Controlling Vcm based on the measured voltage between driver reference 420 and signal reference 422, may allow for selection of C2 and C3 such that $V_p$-$V_n$ increases (e.g., in some cases $V_p$-$V_n$ may increase by a factor of two).

According to aspects of the disclosure herein, Vcm may be controlled based on a state of the output of comparator 408. In such cases, the voltages at comparator inputs $426_1$ and $426_2$ may be initialized to predetermined values to correspond to an initial state of the output of comparator 408. For example, capacitors C2 and C3 may be pre-charged prior to the start of operation of circuit (e.g., by initially setting the output of comparator 408 to predetermined state, which causes voltage generator 416 to initially generate voltages V_1 and V_2 based on this predetermined state). The voltages at comparator inputs $426_1$ and $426_2$ may be initialized to predetermined values based on a known initial state of signal generator 404.

Figure 5:
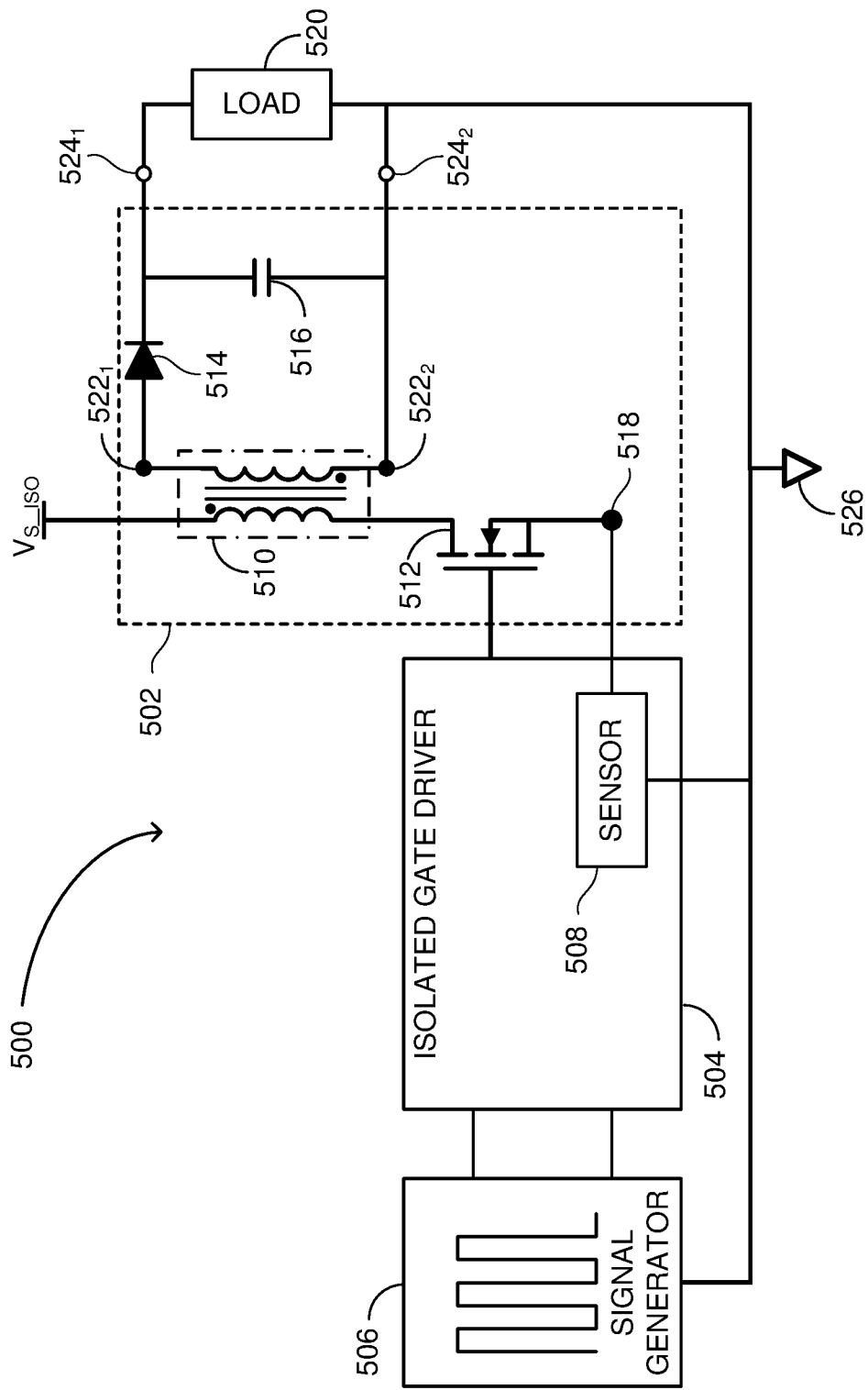
FIG. 5 illustrates an apparatus in accordance with aspects of the disclosure herein.

The examples above are related to an isolated gate driver which may be configured to control the transition of a high-side switch in a half bridge converter. An isolated gate driver according to aspects of the disclosure herein may be configured to control the transition of switches in other types of converters as well. Reference is now made to FIG. 5, which illustrates an apparatus, generally referenced 500, in accordance with aspects of the disclosure herein. Apparatus 500 may comprise a flyback converter 502, an isolated gate driver 504, and a signal generator 506. Flyback converter 502 may comprise a transformer 510, a switch 512, a diode 514, and a capacitor 516. Switch 512 is exemplified as an n-type MOSFET.

The primary side of transformer 510 may be coupled between an isolated supply voltage, labeled 'Vs_iso' in FIG. 5, and a drain of switch 512. Capacitor 516 may be coupled in series with diode 514 at the cathode of diode 514. The series connection of diode 514 and capacitor 516 may be coupled across transformer outputs $522_1$ and $522_2$ of the secondary side of transformer 510 (e.g., such that the anode of diode 514 is coupled to transformer output $522_1$). An output terminal $524_1$ may be coupled to the cathode of diode 514, and an output terminal $524_2$ may be coupled to transformer output $522_2$. The source of switch 512 may be coupled to a driver reference 518. A load 520 may be coupled across output terminals $524_1$ and $524_2$.

Signal generator 506 may be similar to signal generators 104 (FIG. 1), signal generator 204 (FIG. 2A), or to signal generator 404 (FIG. 4), and may be coupled to the input of isolated gate driver 504. Isolated gate driver 504 may be similar to isolated gate driver 400 described above in conjunction with FIG. 4 and may comprise a sensor 508. The output of isolated gate driver 504 may be coupled to the gate of switch 512. Signal generator 506 and load 520 may be referenced to a reference 526. Isolated gate driver 504 and primary side of flyback converter 502 may be referenced to driver reference 518. Sensor 508 may be coupled with reference 526, and with driver reference 518. Sensor 508 may be configured to measure a voltage between reference 526, and driver reference 518. Sensing the voltage between driver reference 518, reference 526 provides information, for example, relating discrepancies between the state of the output of isolated gate driver 504, and the state of switch 512, or may be used to control Vcm to increase the signal to noise ratio.

Figure 6:
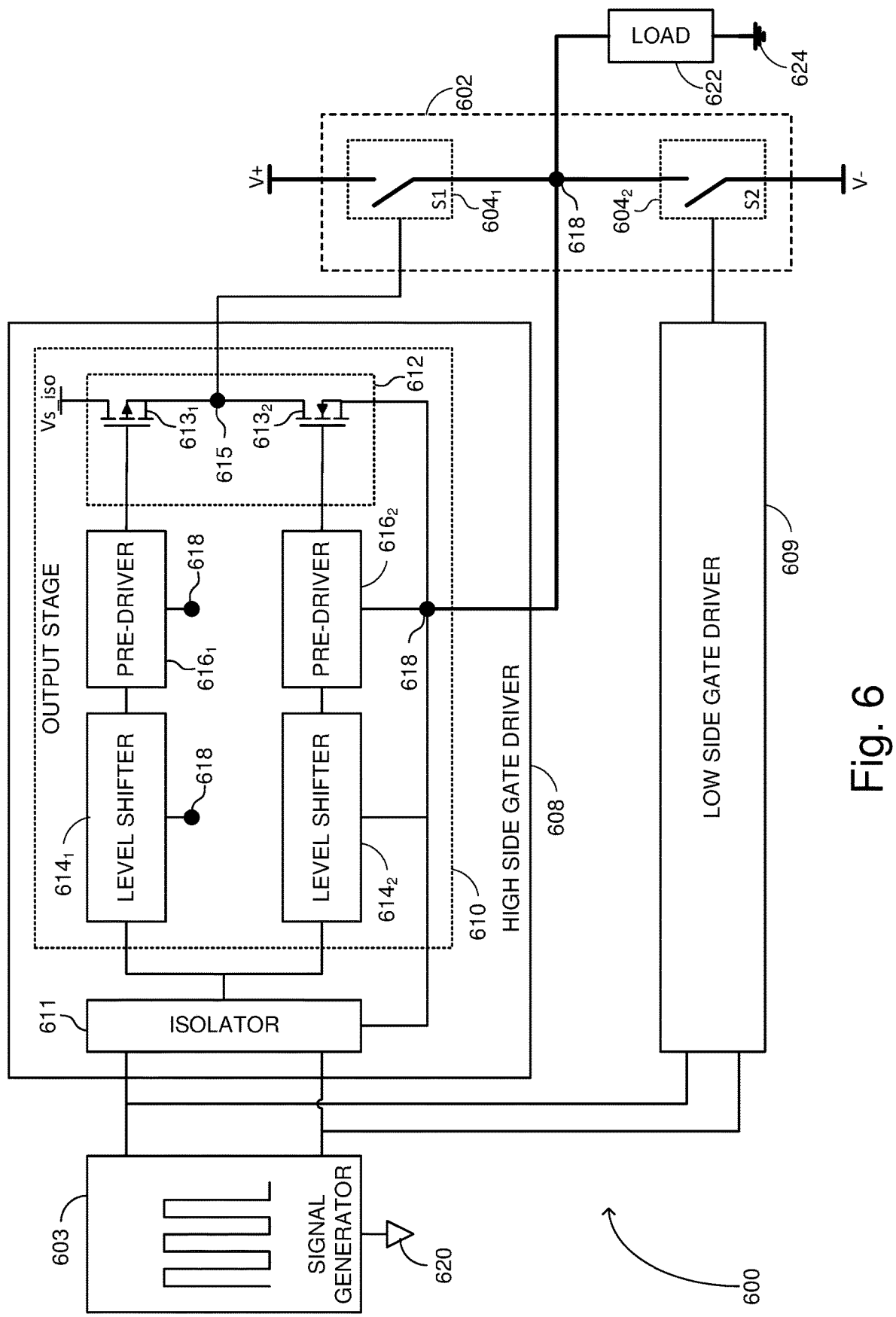
FIG. 6 illustrates an apparatus in accordance with aspects of the disclosure herein.

As mentioned above in conjunction with FIG. 1, an isolated gate driver according to the disclosure may comprise an output stage. Reference is now made to FIG. 6, which illustrates an apparatus, generally referenced 600, in accordance with aspects of the disclosure herein. Apparatus 600 may comprise two gate drivers, high side gate driver 608 and low side gate driver 609. For example, high side gate driver 608 may drive a high side switch $604_1$ of a half bridge 602. Low side gate driver 609 may drive a low side switch $604_2$ of a half bridge 602. High side gate driver 608 may correspond to isolated gate driver 102 (FIG. 1). In the example in FIG. 6, low side switch $604_2$ may be operated complementary to high side switch $604_1$. As such the signals from signal generator 603 provided to low side gate driver 609 may be inverted.

High side gate driver may comprise an isolator 611 coupled to an output stage 610. Isolator 611 may correspond to isolator 108 (FIG. 1), isolator 202 (FIG. 2A), or isolator 402 (FIG. 4). Output stage 610, may correspond to output stage 110 (FIG. 1), and comprise level shifters $614_1$, and $614_2$, pre-drivers $616_1$ and $616_2$ and a push-pull pair 612. Push-pull pair 612 may comprise two switches, $613_1$ and $613_2$ coupled in series at a driving connection point 615. In the example of FIG. 6, switch $613_1$ is illustrated as a p-type MOSFET and switch $613_2$ is illustrated as an n-type MOSFET. Push-pull pair 612 may be coupled between an isolated power supply 'Vs_sup' and a driver reference 618.

Half-bridge converter 602 may comprise switch $604_1$ and a switch $604_2$ connected in series at a switching connection point, which is also driver reference 618. The series connection of switch $604_1$ and switch $604_2$ may be coupled between supply voltage, for example, as indicated by the labels 'V+' and 'V−' in FIG. 6. A load 622 may be connected between driver reference 618 and a power reference 624.

The signal generator 603 may be coupled to isolator 611. Signal generator 603 may be referenced to a signal reference 620. Isolator 611 may be coupled to level shifter 614$_1$, and to level shifter 614$_2$. Level shifter 614$_1$ may be coupled to pre-driver 616$_1$, and level shifter 614$_2$ may be coupled to pre-driver 616$_2$. Pre-driver 616$_1$ may be coupled to a control terminal of switch 613$_1$ of push-pull pair 612. Pre-driver 616$_2$ may be coupled to a control terminal of switch 613$_2$ of push-pull pair 612. Driving connection point 615 may be coupled to the control terminal of switch 604$_1$. Isolator 611, level shifter 614$_1$, level shifter 614$_2$, pre-driver 616$_1$, and pre-driver 616$_2$ may all be referenced to driver reference 618.

Signal generator 603 may generate a signal for controlling the state of switch 604$_1$ and provide the signal to isolator 611. Similar to as described above in conjunction with FIG. 1, 2A, or 4, isolator 611 may generate an output signal which may comprise at least two states, a HIGH state and a LOW state, based on the signal from signal generator 603. For example, the voltage level of the output signal from isolator 611 may be 0V, relative to driver reference 618, at the LOW state. For example, the voltage level of the output signal from isolator 611 may be 3.3V, 5V, 7.5V, or 12V, relative to driver reference 618, at the HIGH state. Isolator 611 may provide the output signal therefrom to level shifter 614$_1$, and to level shifter 614$_2$. Level shifter 614$_1$ may shift the voltage level of the output signal to correspond to the HIGH state or LOW state relative to driving connection point 615. Level shifter 614$_2$ may shift the voltage level of the output signal to correspond to the HIGH state or LOW state relative to driver reference 618. In some cases, level shifter 614$_2$ may be redundant and may be omitted from output stage 610. In some cases, level shifter 614$_2$ may be employed to balance the signal delay from isolator 611 to push-pull pair 612.

Level shifter 614$_1$ may provide the level shifted output signal to pre-drive 616$_1$. Level shifter 614$_2$ may provide the level shifted output signal to pre-driver 616$_2$. Pre-drivers 616$_1$ and 616$_2$ may pre-amplify the power or voltage from the corresponding level shifter 614$_1$, or 614$_2$. Pre-drivers 616$_1$ and 616$_2$ may invert the state of the signal from the corresponding level shifter 614$_1$, or 614$_2$. For example, in cases in which the output signal from isolator is in a HIGH state, the pre-drivers 616$_1$ and 616$_2$ may invert the corresponding level shifted signal to a LOW state.

Push-pull pair 612 may employ the signals from pre-drivers 616$_1$ and 616$_2$, and amplify the power of the output signal from isolator 611. For example, in cases in which the pre-driver signal from pre-driver 616$_1$ and 616$_2$ is in a LOW state (the output signal from isolator 611 is in a HIGH state), switch 613$_1$ may transition to, or maintain a conducting state, and switch 613$_2$ may transition to, or maintain a non-conducting state. Consequently, the voltage level at driving connection point 615 may correspond to 'Vs_iso', which may correspond to a HIGH state of driving connection point 615. For example, in the HIGH state of driving connection point 615, switch 604$_1$ may transition to, or maintain a conducting state. For example, in cases in which the pre-driver signal from pre-driver 616$_1$ and 616$_2$ is in a HIGH state (the output signal from isolator 611 is in a LOW state), switch 613$_1$ may transition to, or maintain a non-conducting state, and switch 613$_2$ may transition to, or maintain a conducting state. Consequently, the voltage level at driving connection point 615 may correspond to the voltage level of driver reference 618, which may correspond to a LOW state of driving connection point 615. For example, in the LOW state of driving connection point 615, switch 604$_1$ may transition to, or maintain a non-conducting state.

In some cases, pre-drivers 616$_1$ and 616$_2$ may not be employed. However, it is noted that in such a case, high side gate driver may be an inverting driver in which the state of driving connection point 615 is complement to the state of the input signal from signal generator 603. Furthermore, in some cases low side gate driver 609 may be similar to high side gate driver 608.

Figure 7:
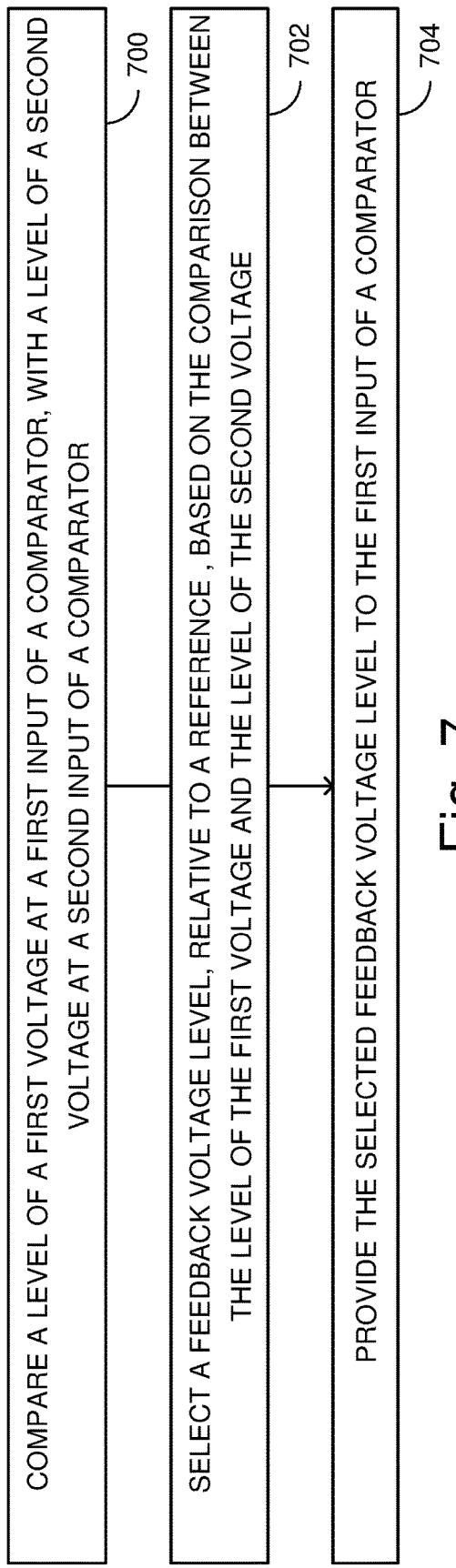
FIG. 7 illustrate methods according to aspects of the disclosure herein.

Reference is now made to FIG. 7, which illustrates a method for an isolated gate driver according to aspects of the disclosure herein. In step 700, compare a level of a first voltage at a first input of a comparator, with a level of a second voltage at a second input of a comparator. The level of the first voltage and the level of the second voltage may correspond to an input signal (e.g., a PWM signal with varying duty cycle), from a signal generator. With reference to FIG. 1, comparator 114 may compare a level of a first voltage level, from input stage 112, at input 109$_1$, with a level of a second voltage, from input stage 112, at input 109$_2$. With reference to FIG. 2A, comparator 208 may compare a first voltage level, from input stage 206, at comparator input 226$_1$, with a level of a second voltage from input stage 206, at comparator input 226$_2$. With reference to FIG. 4, comparator 408 may compare a first voltage level, from input stage 406, at comparator input 426$_1$, with a level of a second voltage from input stage 406, at comparator input 426$_2$.

In step 702, select a feedback voltage level, relative to a reference, based on the comparison between the level of the first voltage and the level of the second voltage. With reference to FIG. 1, feedback circuit 116 may select a feedback voltage level, relative to reference, based on the comparison, by comparator 114, between the level of the first voltage at comparator input 109$_1$ and the level of the second voltage at comparator input 109$_2$. With reference to FIG. 2A, controller 218 may generate a control signal for voltage levels generator 216, based on the output signal from comparator 208. Voltage levels generator 216 generates V_1 (e.g., as described herein above in conjunction with FIGS. 3A-3D), based on a control signal from controller 218. With reference to FIG. 4, controller 418 may generate a control signal for voltage levels generator 416, based on the output signal from comparator 408. Voltage levels generator 416 generates V_1 (e.g., as described herein above in conjunction with FIGS. 3A-3D), based on a control signal from controller 418.

In step 704, provide the selected feedback voltage level to the first input of a comparator. With reference to FIG. 1, feedback circuit 116 applies the selected feedback voltage to input stage 112 (e.g., to comparator input 109$_1$). With reference to FIG. 2A, voltage levels generator 216 applies V_1 to comparator input 226$_1$. With reference to FIG. 4, voltage levels generator 416 applies V_1 to comparator input 426$_1$.

Figure 8:
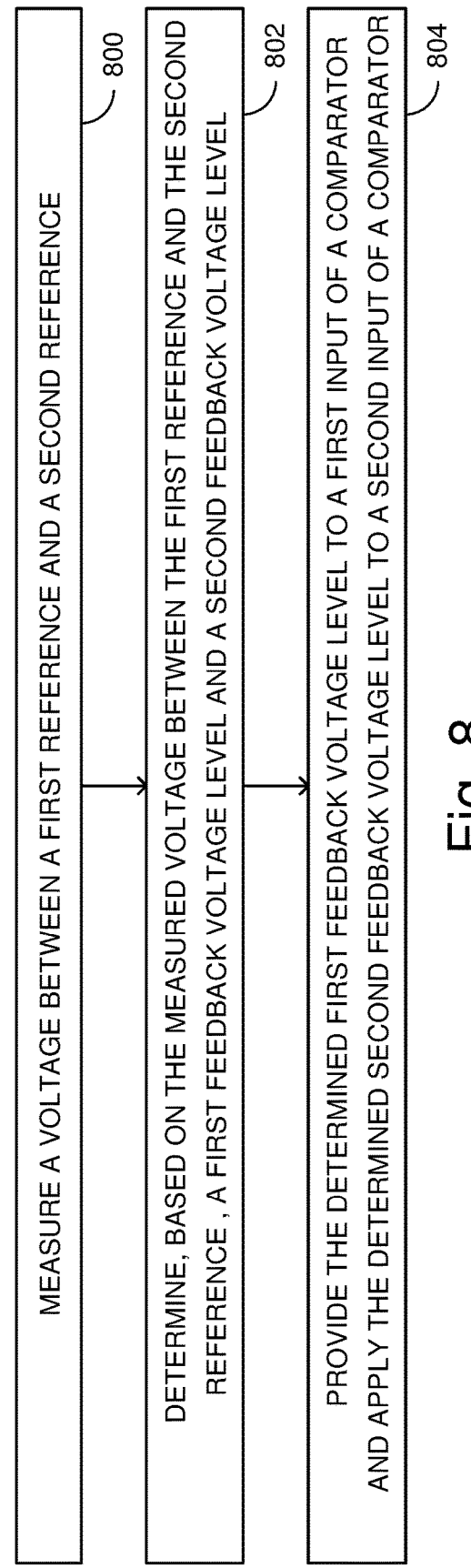
FIG. 8 illustrate methods according to aspects of the disclosure herein.

As mentioned above in conjunction with FIGS. 4 and 5, a sensor may sense the voltage between a reference of a gate driver according to the disclosure herein, and either a power reference or a signal reference or both. A feedback circuit may set the voltage at the inputs of the comparator based on this measurement or measurements. Reference is now made to FIG. 8, which illustrates a method for an isolated gate driver according to the disclosure herein. In step 800, measure, by sensor, a voltage between a first reference and a second reference. For example, with reference to FIGS. 4, sensors 411 measures a voltage between driver reference 420, and signal reference 422. For example, with reference to FIGS. 5, sensors 508 measures a voltage between driver reference 518, and reference 526.

In step 802, determine, based on the measured voltage between the first reference and the second reference, a first feedback voltage level and a second feedback voltage level. For example, controller 418 may control voltage levels generator 416 to set a voltage at comparator input $426_2$ to be one of two voltage levels relative to Vref (e.g., Vcm is set to one of two levels, Vcm1, or Vcm2, relative to Vref). Controller 418 may control voltage levels generator 416 to set a differential voltage at comparator input $426_1$ to be one of two voltage levels relative to Vref (e.g., Vd above Vcm1 or Vcm2, or Vd below Vcm1 or Vcm2).

In step 804, provide the determined first feedback voltage level to a first input of a comparator and provide the determined second feedback voltage level to a second input of a comparator. For example, with reference to FIGS. 4 and 3A, controller 418 may control voltage levels generator 300 to generate V_1 and V_2 based on a measurement from sensor 411 of the voltage between reference 420 and signal reference 422.

As mentioned above, in some cases, an isolator and gate driver according to aspects of the disclosure herein may be implemented on an Integrated Circuit (IC), employing, for example, CMOS techniques and On-Chip metal connections. For example, capacitors C1, C2, C3 and C4 (FIG. 2A, or 4) may be implemented by the metals employed in the IC. Reference is now made to FIGS. 9A and 9B which illustrate examples of capacitors, generally referenced 900 and 950 respectively, implemented using metal in an IC. In FIG. 9A, IC capacitor 900 may comprise a first electrode 902 and a second electrode 904. Second electrode 904 is isolated from first electrode 902 (e.g., by a dielectric material such as silicon dioxide or silicon carbide). In the example of FIG. 9A, first electrode 902 may comprise three metal layers 906, 908, and 910 connected there between by via's such as via 912. Second electrode 904 may comprise two metal layers 908 and 910 connected by a via. The capacitance of capacitor 900 may be selected by selecting a horizontal spacing 914 between first electrode 902 and second electrode 904.

In FIG. 9B, IC capacitor 950 may comprise a first electrode 952 and a second electrode 954. Second electrode 954 is isolated from first electrode 942 (e.g., by a dielectric material such as silicon dioxide or silicon carbide). In the example of FIG. 9B, first electrode 942 may comprise three metal layers 956, 958, and 960 connected there between by vias, such as via 962. In the example of FIG. 9B, second electrode 904 may comprise one metal layer 960. The capacitance of capacitor 950 may be selected by omitting metal layers, thus increasing the vertical spacing 964 between first electrode 952 and second electrode 954.

The AC couplers of the isolated gate drivers described herein above in conjunction with FIGS. 2A, and 4, comprised a capacitive divider. However, an isolator according to the disclosure herein may be employed with other types of AC couplers. Reference is now made to FIGS. 10A, 10B, 10C and 10D, which illustrate various types of AC couplers, generally referenced 1000, 1010, 1020, and 1030 respectively, in accordance with aspects of the disclosure herein. Each one of AC couplers 1000, 1010, 1020, or 1030 may be employed as one of AC coupler 212 or AC coupler 214 of FIG. 2A. Each one of AC couplers 1000, 1010, 1020, or 1030 may be employed as one of AC coupler 412 or AC coupler 414 of FIG. 4.

Figures 10A, 10B, 10C, 10D:
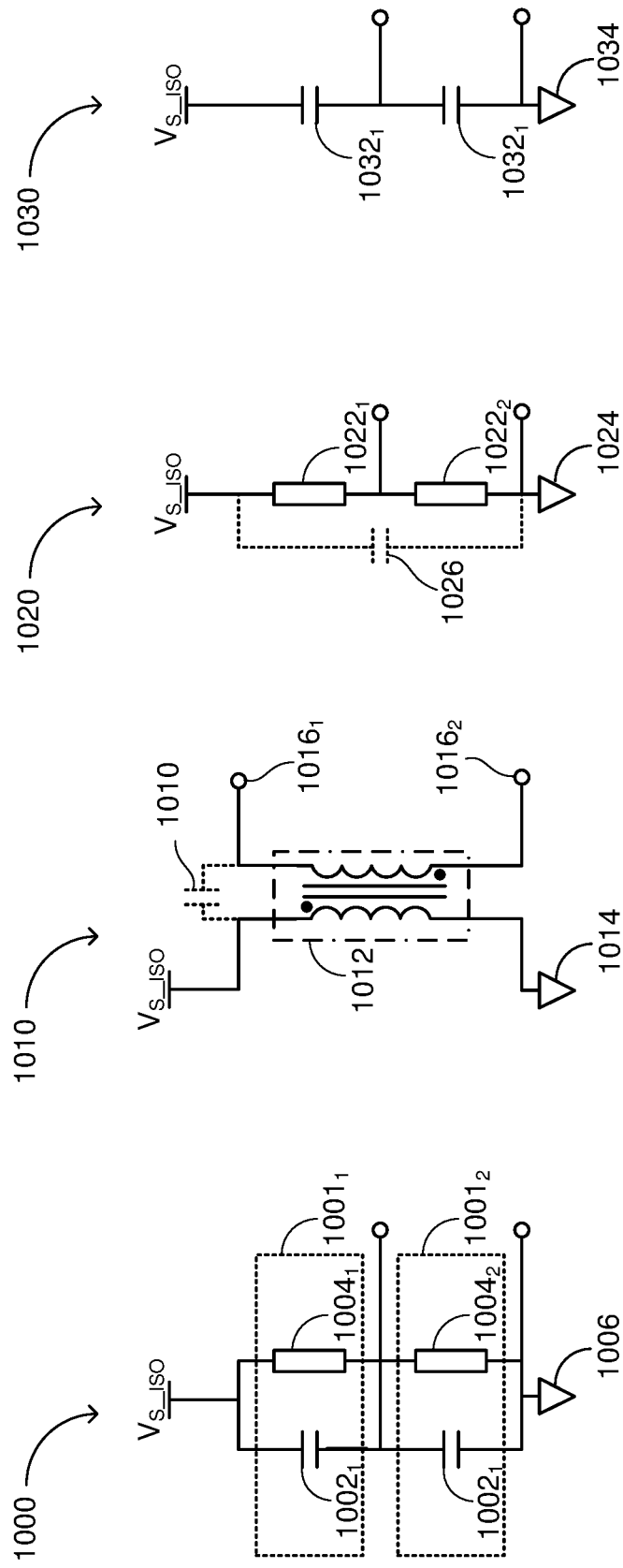
FIGS. 10A-10D illustrate examples of AC couplers according to aspects of the disclosure herein.

With reference to FIG. 10A, AC coupler 1000 may comprise an impedance divider, which may comprise two impedances $1001_1$ and $1001_2$ connected in series between an isolated supply voltage, 'Vs_iso', and a reference 1006. Impedance $1001_1$ may comprise a capacitor $1002_1$ coupled in parallel with a resistor $1004_1$. Impedance $1001_2$ may comprise a capacitor $1002_2$ coupled in parallel with a resistor $1004_2$.

With reference to FIG. 10B, AC coupler 1010 may comprise a transformer 1012. A primary side of the transformer may be coupled between an isolated supply voltage, 'Vs_iso', and a reference 1014. The secondary side of transformer 1012 may be coupled between output $1016_1$ and $1016_2$. Transformer 1012 may comprise a parasitic capacitance 1010 between the primary and secondary windings of transformer 1012.

With reference to FIG. 10C, AC coupler 1020 may comprise a resistive divider, which may comprise two resistors $1022_1$ and $1022_2$ connected in series between an isolated supply voltage, 'Vs_iso', and a reference 1024. The resistive divider may comprise a parasitic capacitance 1026.

With reference to FIG. 10D, AC coupler 1030 may comprise a capacitive divider, which may comprise two capacitors $1032_1$ and $1032_2$ connected in series between an isolated supply voltage, 'Vs_iso', and a reference 1034. The capacitive divider may comprise a parasitic capacitance 1026.

Reference is now made to FIGS. 11A-11F, which illustrate examples of waveforms according to aspects of the disclosure herein. In FIGS. 11A-11F, 'Vp' relates to a voltage at first input of a comparator (e.g., first input $109_1$—FIG. 1, first input $226_1$—FIG. 2A, first input $426_1$—FIG. 4). 'Vn' relates to a voltage at a second input of the comparator (e.g., second input $109_2$— FIG. 1, second input $226_2$—FIG. 2A, second input $426_2$—FIG. 4). 'Vref' relates to a voltage at a driver reference (e.g., driver reference 118—FIG. 1, driver reference 220—FIG. 2A, driver reference 420—FIG. 4, driver reference 518—FIG. 5, driver reference 618—FIG. 6). In the description of FIGS. 11A-11F, reference is also made to FIG. 2A for the sake of explanation. However, it is understood that the illustrations in FIGS. 11A-11F relate to an isolated gate driver, as described in any of the figures of the disclosure herein.

Figure 11A:
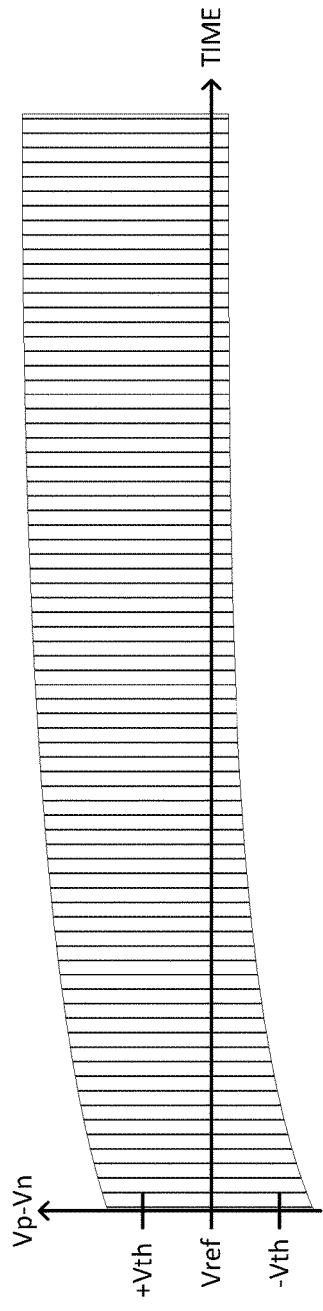
FIGS. 11A-11F illustrate examples of waveforms according to aspects of the disclosure herein.
Figure 11B:
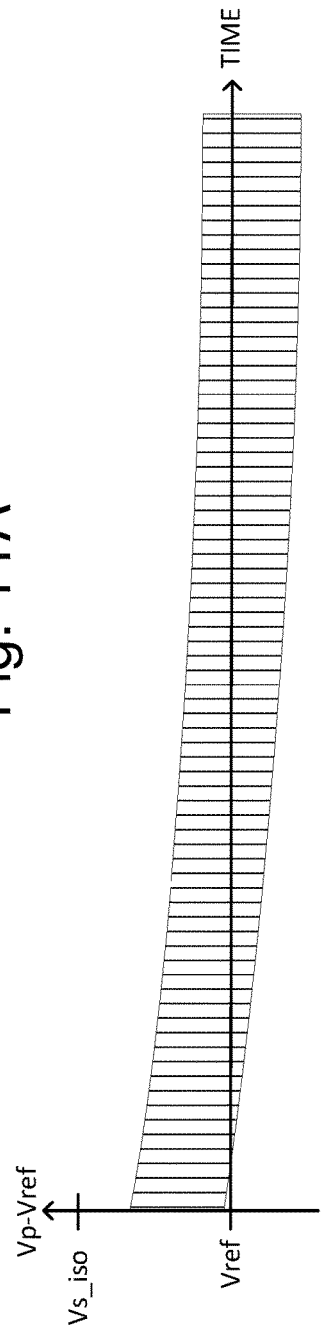
Figure 11C:
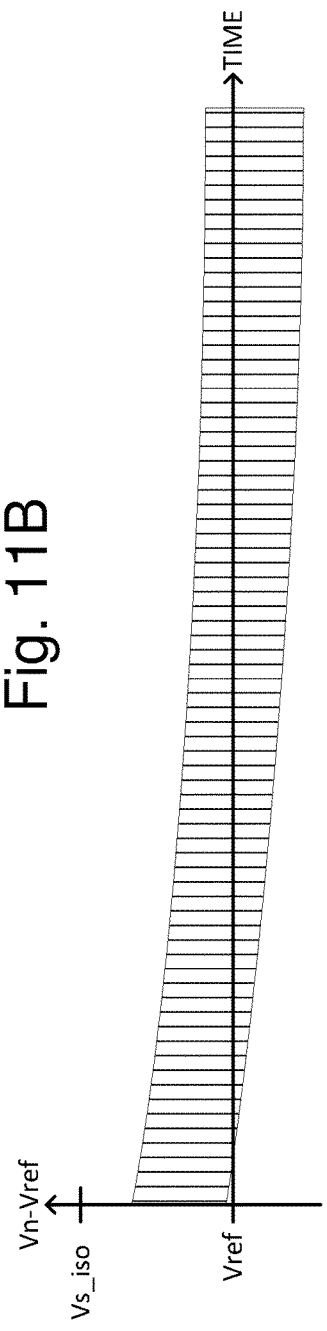
Figure 11D:
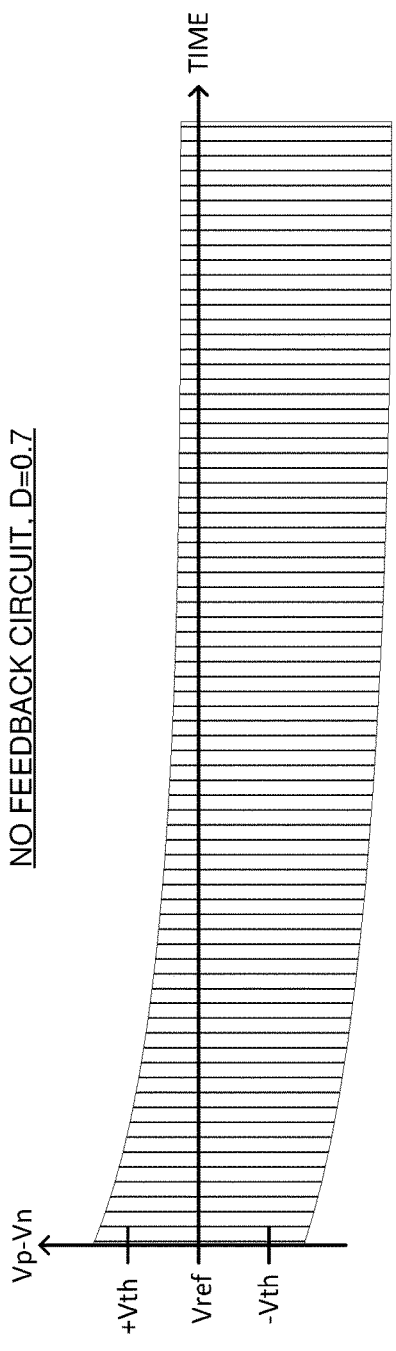
Figure 11E:
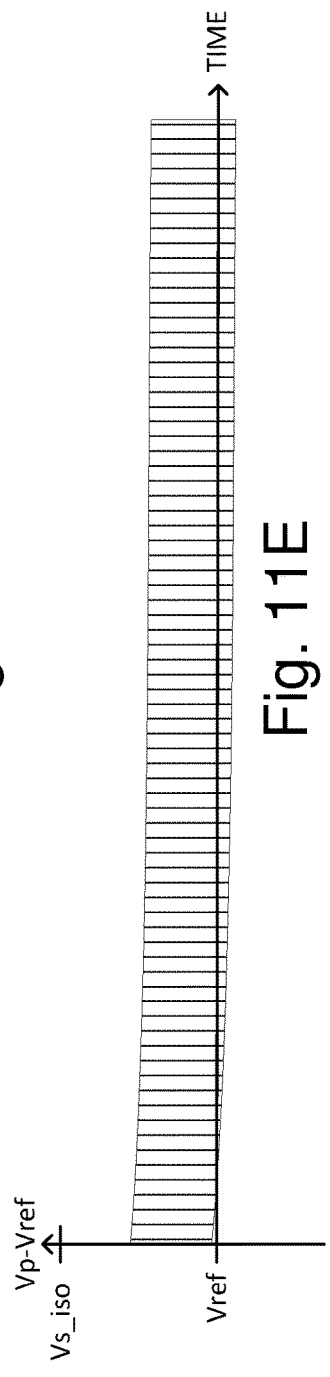
Figure 11F:
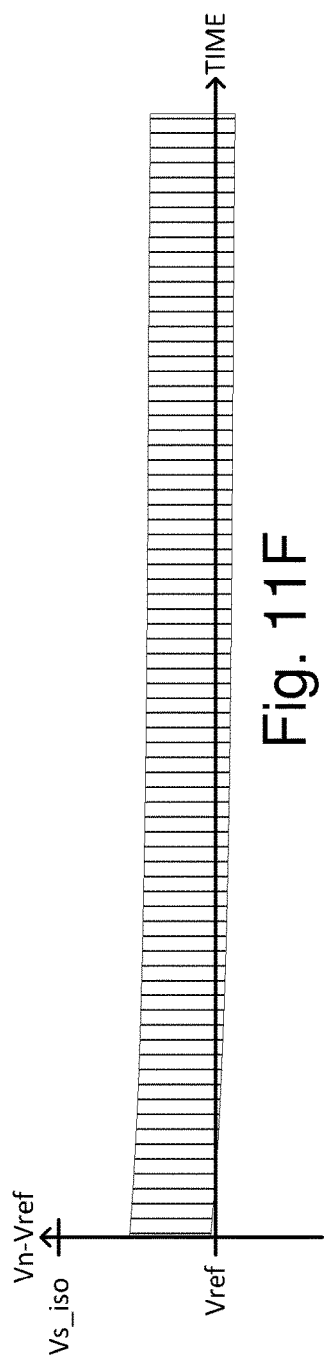

FIGS. 11A-11F illustrate an example in which no feedback is used between comparator output 228 and first input $226_1$ of comparator 208. FIGS. 11A-11C illustrate an example in which a duty cycle, D, of a PWM input signal is 0.3 (D=0.3). FIGS. 11D-11F illustrate an example in which the duty cycle, D, of a PWM input signal is 0.7 (D=0.7). In the examples of FIGS. 11A-11F, capacitors C2, and C3 of the AC couplers 212 and 214 respectively, have been pre-charged to correspond to a low state of the input PWM signal, and thus, a low state at the output of comparator 208. For example, C3 may be pre-charged to (Vs_iso−Vref)/2, and C2 may be pre-charged to (Vs_iso−Vref−Viso_pwm)/2. Viso_pwm corresponds to the change in the voltage level over C2, in cases in which the PWM signal changes states. For example, Viso_pwm may depend on the capacitance values of C1 and C2 (e.g., C1 and C2 may form a capacitance divider). For example, in cases in which Vs_iso−Vref=5V and Viso_pwm=0.05V, C2 may be pre-charged to 2.475V and C3 may be pre-charged to 2.5V. Therefore, the initial voltage at the first input $226_1$ of comparator 208 may be 2.475V, relative to Vref, and the initial voltage at second input $226_2$ of comparator 208 may be 2.5V, relative to Vref.

FIG. 11A illustrates an example of the voltage difference, Vp-Vn, between the voltage, Vp, at first input $226_1$ of comparator 208, and the voltage, Vn, at second input $226_2$ of comparator 208, in cases in which D=0.3. FIG. 11B illustrates an example of the voltage difference, Vp-V$_{ref}$, between the voltage at first input 226$_1$, Vp, and the voltage, Vref, at driver reference 220, in cases in which D=0.3. FIG. 11C illustrates an example of the voltage difference, Vn-V$_{ref}$, between the voltage at second input 226$_2$, Vn, and Vref, in cases in which D=0.3.

As illustrated in FIG. 11A, Vp-Vn may initially exceed the upper and lower thresholds of the comparator (e.g., +Vth, and −Vth in FIG. 11A). However, as time progresses, leakage of capacitor C2, or C3, or both, which may result in a modulation of Vref due to the duty cycle, D, of the PWM signal being lower than 0.5, and may cause Vp-Vn, to rise relative to Vref. Vp-Vn, may rise to a level in which Vp-Vn does not fall below the negative threshold voltage, −Vth, of comparator 208. In such a case, comparator 208 may latch to a high output state. The rise in the voltage level Vp-Vn may be regarded as the modulation of Vref (e.g., Vref reduces in cases in which D<0.5). As illustrate in FIGS. 11B and 11C, initially, Vp-Vref and Vn-Vref respectively, may be between the voltage, Vref, at driver reference 220, and the isolated supply voltage, Vs_iso. However, as time progresses, leakage of capacitor C2, or C3, or both, may cause Vp-Vref, Vn-Vref, or both, to fall below Vref.

FIG. 11D illustrates an example of the voltage difference, Vp-Vn, between the voltage, Vp, at first input 226$_1$ of comparator 208, and the voltage, Vn, at second input 226$_2$ of comparator 208, in cases in which D=0.7. FIG. 11E illustrates the voltage difference, Vp-Vref, between the voltage at first input 226$_1$, Vp, and the voltage, Vref, at driver reference 220, in cases in which D=0.7. FIG. 11F illustrates an example of the voltage difference, Vn-Vref, between the voltage at second input 226$_2$, Vn, and Vref, in cases in which D=0.7.

As illustrate in FIG. 11D, Vp-Vn may initially exceed the upper and lower thresholds of the comparator (e.g., +Vth, and −Vth in FIG. 11D). However, as time progresses, leakage of capacitor C2, or C3, or both, which may result in a modulation of Vref due to the duty cycle, D, of the PWM signal being higher than 0.5, and may cause Vp-Vn, to fall relative to Vref. Vp-Vn, may fall to a level in which Vp-Vn does not rise above the positive threshold voltage, +Vth, of comparator 208. In such a case, comparator 208 may latch to a low output state. The reduction in the voltage level Vp-Vn may be regarded as the modulation of Vref (e.g., Vref increases in cases in which D>0.5). As illustrate in FIGS. 11E and 11F, initially, Vp-Vref and Vn-Vref respectively, may be between the voltage at driver reference 220 and the isolated supply voltage, Vs_iso. However, as time progresses, leakage of capacitor C2, or C3, or both, may cause Vp-Vref, Vn-Vref, or both, to fall below Vref.

Reference is now made to FIGS. 12A-12L, which illustrate examples of waveforms according to aspects of the disclosure herein. In FIGS. 12A-12L, 'Vp' relates to a voltage at a first input of a comparator (e.g., first input 109$_1$—FIG. 1, first input 226$_1$—FIG. 2A, first input 426$_1$—FIG. 4). 'Vn' relates to a voltage a second input of at a comparator (e.g., second input 109$_2$—FIG. 1, second input 226$_2$—FIG. 2A, second input 426$_2$—FIG. 4). 'Vref' relates to a voltage at a driver reference (e.g., driver reference 118—FIG. 1, driver reference 220—FIG. 2A, driver reference 420—FIG. 4, driver reference node 518—FIG. 5, driver reference node 618—FIG. 6).

Figure 12G:
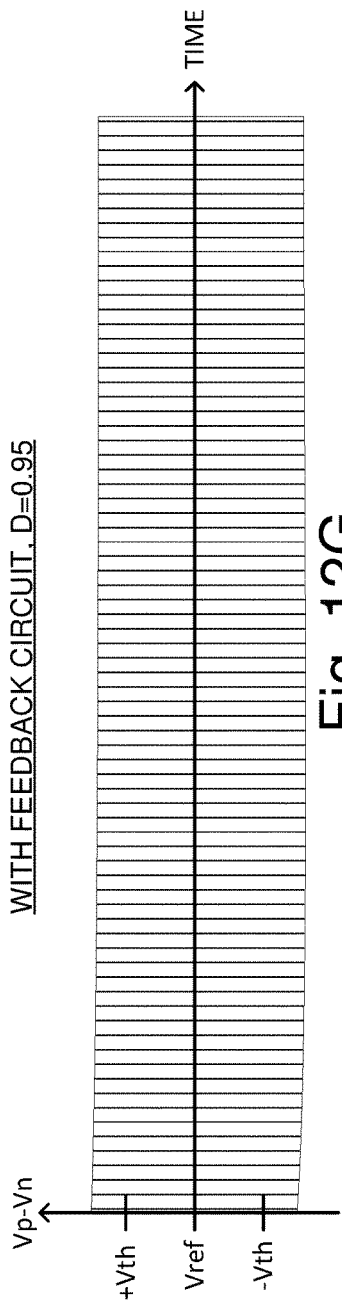
Figure 12H:
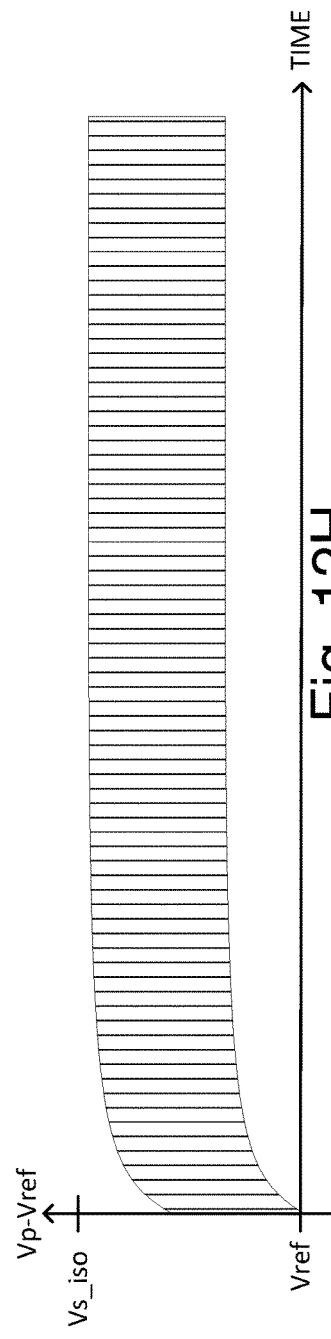
Figure 12I:
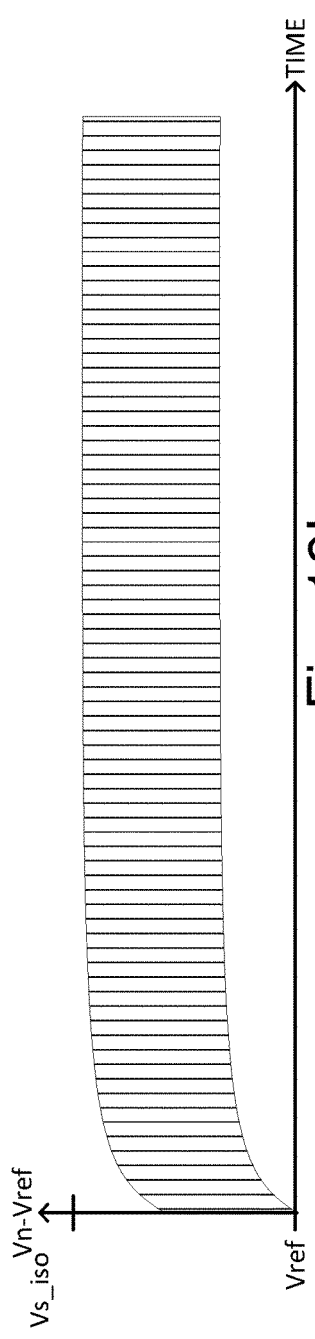

FIGS. 12A-12F illustrate examples in which feedback, (e.g., a feedback circuit as described above in conjunction with FIG. 1, 2A, 3A-3D, or 4) is used between the output and input of the comparator. As mentioned above in conjunction with FIGS. 1, 2A, and 4, the feedback may be used to control the voltage levels at the inputs of the comparator, such that a change in voltage level of the input signal may result in a change in voltage level in the output of the comparator (e.g., reducing the probability of error due to varying duty cycles of the input signal or leakage of the capacitors). FIGS. 12A-12C illustrate a case in which a duty cycle, D, of a PWM input signal is 0.3 (D=0.3). FIGS. 12D-12F illustrate a case in which the duty cycle, D, of a PWM input signal is 0.7 (D=0.7). FIGS. 12G-12I illustrate a case in which the duty cycle, D, of a PWM input signal is 0.95 (D=0.95), and FIGS. 12J-12L illustrate a case in which the duty cycle, D, of a PWM input signal is 0.05 (D=0.05). As illustrated in FIG. 12A, 12D, 12G, or 12J, in cases in which a feedback circuit as described above is used, Vp-Vn rises above +Vth or falls below −Vth regardless of the duty cycle. As illustrated in FIG. 12B, 12E, 12H, or 12K, in cases in which a feedback circuit as described above is used, Vp-Vref remains between Vref and Vs_iso regardless of the duty cycle. As illustrated in FIG. 12C, 12F, 12I, or 12L, in cases in which a feedback circuit as described above is used, Vn-Vref also remains between Vref and Vs_iso regardless of the duty cycle.

In view of FIGS. 12A-12K, a feedback circuit according to the disclosure herein (e.g., feedback circuit 116—FIG. 1, feedback circuit 116—FIG. 1, feedback circuit 216—FIG. 2A, feedback circuit 416—FIG. 4) may be configured to control the voltage levels at the inputs of the comparator (e.g., inputs 109$_1$ and 109$_2$ of comparator 114—FIG. 1, inputs 226$_1$ and 226$_2$ of comparator 208, inputs 426$_1$ and 426$_2$ of comparator 408—FIG. 1) to be within determined values (e.g., to be between a reference voltage level, V_ref, and a supply voltage level of the circuit Vs_iso). A feedback circuit according to the disclosure herein may be configured to control a difference between the voltage levels at the inputs of the comparator to be above or below a threshold or thresholds levels of the comparator (e.g., +Vth, and −Vth). A feedback circuit according to the disclosure herein may be configured to control a midpoint of a difference between the voltage levels at the inputs of the comparator to be within predetermined values (e.g., control the difference midpoint to be centered about a value, within tolerances). For example, the feedback circuit may control a midpoint of a difference between the voltage levels at the inputs of the comparator to be about zero within determined tolerances. As further explained herein below in conjunction with FIGS. 13A-13E, a feedback circuit according to the disclosure herein may be configured to control the average of a difference between the voltage levels at the inputs of the comparator to be within a determined value (e.g., regardless of the duty cycle of the input signal).

Reference is now made to FIGS. 13A-13E, which illustrate timing diagrams and models in accordance with aspects of the disclosure herein. In the description of FIGS. 13A-13D which follows, Vp may represent an instantaneous voltage at a first input of a comparator (e.g., first input 226$_1$ of comparator 208—FIG. 2A), and Vn may represent an instantaneous voltage at a second input of the comparator (e.g., second input 226$_2$ of comparator 208—FIG. 2A). <Vp> may represent an average voltage at the first input of the comparator, and <Vn> may represent an average voltage at a second input of the comparator. <Vp-Vn> may represent the average of the difference between Vp and Vn.

Figure 13A:
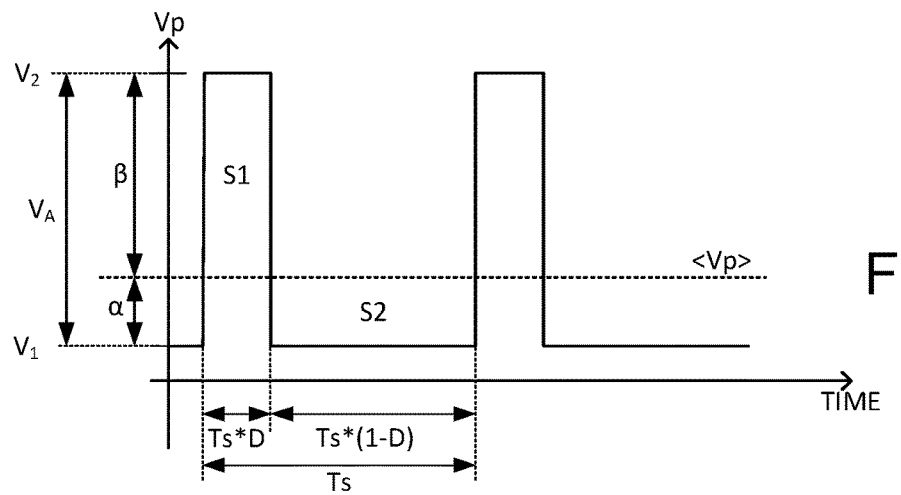
FIGS. 13A-13E illustrate timing diagrams and models in accordance with aspects of the disclosure herein.
Figure 13B:
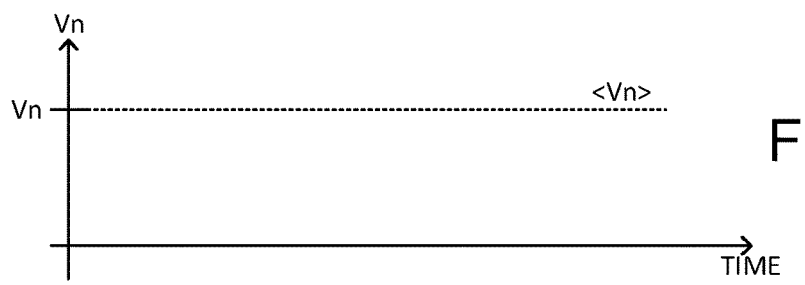

In the example of FIGS. 13A-13D, Vp transitions between a first voltage level, V_1, and a second voltage level, V2 (e.g., a pulsed signal as illustrated in FIG. 13A), and Vn remains constant. The signal at the first input (e.g., a pulsed PWM signal) may average over capacitor C2 (e.g., FIG. 2A, or FIG. 4) at an average value of <Vp>. In such a case, the area S1, should equal the area S2 in FIG. 13A. This condition may be expressed by the following equations:

$$Ts*D*\beta = Ts*(1-D)*\alpha \qquad (3)$$

where $$\alpha + \beta = Va \qquad (4)$$

From equations (3) and (4) and FIG. 13A, the following equations may be written:

$$\alpha = D*Va \qquad (5)$$

$$\beta = (1-D)*Va \qquad (6)$$

$$V1 = <Vp> - \alpha \qquad (7)$$

$$V2 = <Vp> + \beta \qquad (8)$$

where V1 and V2 are the voltage levels of Vp, relative to a reference. In cases in which Vp-Vn toggles between a first voltage level, $\tilde{V}1$, and a second voltage level, $\tilde{V}2$, it may be required that:

$$\frac{\tilde{V}_1 + \tilde{V}_2}{2} = 0 \qquad (9)$$

$\tilde{V}1$ and $\tilde{V}2$ may be written as follows:

$$\tilde{V}_1 = V1 - <Vn> \qquad (10)$$

$$\tilde{V}_2 = V2 - <Vn> \qquad (11)$$

Using equations (5)-(8), and (10)-(11) with equation (9), may result in the following:

$$<Vp> - <Vn> = (Va/2)*(2D-1) \qquad (12)$$

Figure 13C:
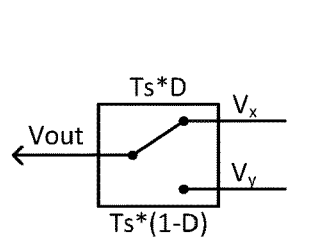
Figure 13D:
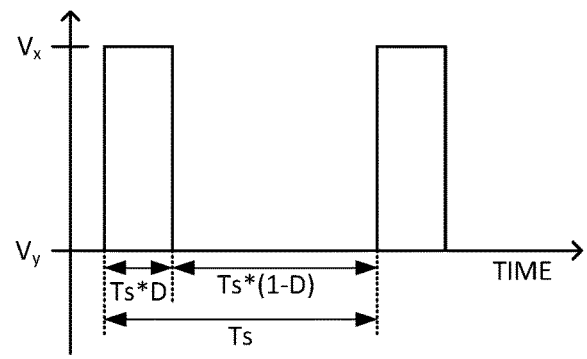

Equation 12 relates to the requirement for maintain <Vp-Vn>=0 (e.g., centered around Vref as illustrated in FIG. 12A, 12D, 12G, or 12J). Referring to FIGS. 13C and 13D, a model of a PWM switch may be expressed as follows:

$$Vout = D*Vx + (1-D)*Vy \qquad (13)$$

Vx and Vy may be expressed as a difference voltage, ΔV, above or below a common voltage respectively, as follows:

$$Vx = Vcom + \Delta V \qquad (14)$$

$$Vy = Vcom - \Delta V \qquad (15)$$

Using equations (14) and (15) with Equation (13), it may be shown that:

$$Vout = Vcom + \Delta V*(2D-1) \qquad (16)$$

If we let <Vn>=Vcom, <Vp>=Vcom+ΔV*(2D-1), and ΔV=Va/2, then the requirement of Equation 12 may be satisfied using a PWM switch (e.g., a feedback circuit producing a feedback voltage modulated based on a PWM signal). This condition may be implemented, for example, with voltage generators 320 or 330 described above in conjunction with FIGS. 3C and 3D, where V1-V2=Va/2, and Va=Vs_iso, and switch 324 or 334 being modulated by a PWM signal (e.g., from an output of a comparator such as comparator 114, 210 or 410 in FIG. 1, 2A or 4).

Figure 13E:
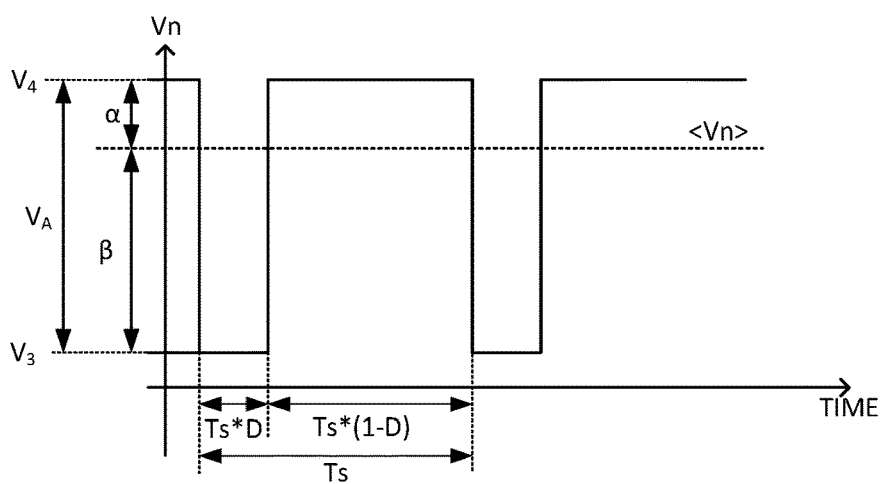

A similar derivation may be used in cases in which Vn also transitions between a high and low state (e.g., as depicted in FIG. 13E) employing the following equations:

$$V3 = <Vn> + \alpha \qquad (17)$$

$$V4 = <Vp> - \beta \qquad (18)$$

$$\tilde{V}_1 = V1 - V4 \qquad (19)$$

$$\tilde{V}_2 = V2 - V3 \qquad (20)$$

which may result in the following:

$$<Vp> - <Vn> = Va*(2D-1) \qquad (21)$$

In equation (21), ΔV may equal Va. Based on a comparison between Equation (21) with Equation (12), the input signal into the comparator, <Vp>-<Vn>, is larger by a factor of two in cases where Vn also transitions between a high and low state. This may result in an increased signal-to-noise ratio (SNR) of the driving signal, which may result in a lower probability of error.

An advantage of an isolated gate driver according to aspects of the disclosure herein may be that isolated gate driver 102 may be coupled directly to the signal generator, without intermediate circuitry (e.g., inverters, flip flops, encoders, biasing circuits, oscillators, rectifiers and the like). This may provide various additional advantages. For example, in some cases, the capacitances of C1, C2, C3, or C4 may deviate from the designed values (e.g., due to imperfections in the manufacturing process and the like). To overcome these deviations, an isolated gate driver according to aspects of the disclosure herein may be calibrated. For example, and with reference to FIG. 2A, one or more of capacitors C1, C2, C3, or C4 may be a varying capacitor, with a capacitance that may be controlled. Predetermined input signals, each having a corresponding different voltage level, may be received by the input stage 206 at terminals 224₁ and 224₂. These predetermined input signals, with the corresponding varying voltage levels, may have corresponding expected outputs (e.g., high level signal, or low level signal) from gate driver 200. By measuring the outputs resulting from the predetermined input signals, and comparing the measured outputs with the expected outputs, a deviation of the state of the output from comparator 208, relative to the expected output may be determined. Consequently, a deviation of the input into comparator 208, relative to the expected input (e.g., derived from the predetermined signals and the designed values of capacitors C1, C2, C3, and C4) may be determined. In cases in which such a deviation is determined, the capacitance of the varying capacitor may be adjusted to minimize these deviations.

Another advantage of a gate driver of the disclosed technique may relate to quality control. Similar to as described above regarding calibration, predetermined input signals, each having a corresponding different voltage level, may be received by the input stage 206 at terminals 224₁ and 224₂. These predetermined input signals, with predetermined varying voltage levels, may have corresponding expected outputs (e.g., high level signal, or low level signal) from gate driver 200. By measuring the outputs resulting from the predetermined input signals, and comparing the measured outputs with the expected outputs, a determination may be made at what voltage levels the tested gate driver fails, and the gate driver may be rated accordingly. For example, a gate driver that failed at low voltage levels may be rated higher than a gate driver that failed at high voltage levels.

One or more aspects of the disclosure may be embodied in computer-usable data and computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Various aspects will be highlighted in a set of numbered clauses herein. These aspects are not to be interpreted as being limiting of the invention or inventive concept, but are provided merely to highlight some features as described herein, without suggesting a particular order of importance or relevancy of such aspects.

We claim:

1. A gate driver comprising:
   an input stage comprising a first input, a second input, a first Alternating Current (AC) coupler, and a second AC coupler, wherein the first AC coupler is coupled between the first input and a third input of the input stage, and the second AC coupler is coupled between the second input and a fourth input of the input stage, wherein the input stage is configured to receive, at the first input and the second input, an input signal having an input voltage that corresponds to one of a first state and a second state, and provide a second signal to the third input and the fourth input based on the input signal;
   a comparator comprising an output, wherein the comparator is configured to provide an output signal at the output based on a comparison between a level of a first voltage at the third input, and a level of a second voltage at the fourth input, the level of the first voltage and the level of the second voltage corresponds to the second signal, the output signal comprises one of the first state and the second state; and
   a feedback circuit, coupled to the output of the comparator, wherein the feedback circuit is configured to receive the output signal, and provide, based on the output signal, a first feedback voltage to the third input, and a second feedback voltage to the fourth input, wherein a level of the first feedback voltage is based on the level of the first voltage, to control the level of the first voltage and the level of the second voltage, such that a change in a state of the input signal results in a change in a state of the output from the comparator.

2. The gate driver of claim 1, wherein the feedback circuit is configured to generate, based on the output signal, the first feedback voltage to correspond to the first voltage.

3. The gate driver of claim 2, wherein the output signal comprises a state of at least two states,
   wherein each of the at least two states correspond to one of at least two voltage levels,
   wherein the feedback circuit is further configured to receive the output signal and set, based on the state of the output signal, the level of the first feedback voltage to one of the at least two voltage levels.

4. The gate driver of claim 3, wherein a level of a first one of the at least two voltage levels is a first predetermined value above a first reference,
   wherein a level of a second one of the at least two voltage levels is a second predetermined value below the first reference.

5. The gate driver of claim 4, wherein the feedback circuit comprises a voltage levels generator and an impedance, and
   wherein the voltage levels generator is configured to generate the first feedback voltage and provide the first feedback voltage to the third input via the impedance.

6. The gate driver of claim 5, wherein the voltage levels generator is configured to generate the at least two voltage levels, and the level of the second feedback voltage.

7. The gate driver of claim 5, wherein the feedback circuit further comprises a controller, coupled to the output of the comparator, and to the voltage levels generator,
   wherein the controller is configured to provide a control signal based on the output signal,
   wherein, based on the control signal, the voltage levels generator provides the first feedback voltage to the third input.

8. The gate driver of claim 5, wherein the first input and the second input are referenced to a second reference,
   wherein the third input and the fourth input are referenced to the first reference, and
   wherein the input stage is configured to provide DC isolation between the first reference and the second reference.

9. The gate driver according to claim 8, wherein the first AC coupler comprises a first capacitor coupled to the first input and to the third input, a second capacitor coupled between the third input and the first reference, and
   the second AC coupler comprises a third capacitor coupled to the second input and to the fourth input and a fourth capacitor coupled between the fourth input and the first reference.

10. The gate driver of claim 8, wherein the feedback circuit further comprises a sensor coupled to the controller, and further coupled between one of:
    the first reference and a third reference, or
    between the first reference and the second reference,
    wherein the third reference corresponds to a switching connection point,
    wherein the sensor is configured to measure a voltage between one of:
    the first reference and the third reference, or
    the first reference and the second reference,
    wherein the sensor is configured to provide the controller with a measurement relating to the measured voltage, and
    wherein the level of the first feedback voltage and the level of the second feedback voltage are based on a voltage level between the second reference and the first reference.

11. The gate driver of claim 8, wherein the output signal is configured to control a first switch, coupled in series with a second switch at a switching connection point,
    wherein the switching connection point corresponds to the first reference.

12. A method comprising the steps of:
    receiving, from a signal generator, at a third input and a fourth input, an input signal having an input voltage that corresponds to one of a first state and a second state;

comparing, by a comparator, a level of a first voltage at a first input of the comparator, with a level of a second voltage at a second input of the comparator;

selecting, by a feedback circuit, and based on the comparison, a first feedback voltage; and providing, by the feedback circuit, the first feedback voltage to the first input, wherein the first input of the comparator is DC isolated from the third input, wherein the second input of the comparator is DC isolated from the fourth input, wherein the level of the first feedback voltage is based on the level of the first voltage, and is to control the level of the first voltage and the level of the second voltage, such that a change in a state of the input signal results in a change in a state of an output signal from the comparator.

13. The method of claim 12, further comprising the step of providing, by the feedback circuit, a second feedback voltage to the second input.

14. The method of claim 13, further comprising the step of generating, by the feedback circuit, a level of the first feedback voltage based on the level of the first voltage.

15. The method of claim 12, further comprising the step of detecting a state, of at least two states of the output signal, wherein the state of the output signal is based on the comparison between the level of the first voltage and the level of the second voltage, wherein the first voltage comprises at least two voltage levels, and wherein each of the at least two states correspond to one of the at least two voltage levels of the first voltage.

16. The method of claim 15, further comprises setting, based on the state of the output signal, the level of the first feedback voltage to one of the at least two voltage levels.

17. The method of claim 15, wherein the third input and the fourth input are referenced to a first reference, wherein the first input and the second input are referenced to a second reference.

18. The method of claim 17, further comprising operating a first switch, coupled in series with a second switch at a switching connection point, wherein the switching connection point corresponds to the second reference.

19. The method of claim 17, further comprising:

measuring a voltage difference between the first reference and a third reference;

selecting the level of the first feedback voltage based on a measurement of a voltage difference between the first reference and the third reference, wherein the third reference corresponds to a switching connection point.

* * * * *